United States Patent
Takeda et al.

(10) Patent No.: US 11,005,631 B2
(45) Date of Patent: May 11, 2021

(54) TERMINAL, BASE STATION AND RADIO COMMUNICATION METHOD FOR SEPARATELY ENCODING UPLINK CONTROL INFORMATION

(71) Applicant: NTT DOCOMO, INC., Tokyo (JP)

(72) Inventors: Kazuki Takeda, Tokyo (JP); Satoshi Nagata, Tokyo (JP)

(73) Assignee: NTT DOCOMO, INC., Tokyo (JP)

( * ) Notice: Subject to any disclaimer, the term of this patent is extended or adjusted under 35 U.S.C. 154(b) by 0 days.

(21) Appl. No.: 15/762,144

(22) PCT Filed: Sep. 9, 2016

(86) PCT No.: PCT/JP2016/076565
§ 371 (c)(1),
(2) Date: Mar. 22, 2018

(87) PCT Pub. No.: WO2017/051724
PCT Pub. Date: Mar. 30, 2017

(65) Prior Publication Data
US 2018/0352545 A1    Dec. 6, 2018

(30) Foreign Application Priority Data

Sep. 24, 2015    (JP) .............................. JP2015-187123

(51) Int. Cl.
*H04L 5/00*    (2006.01)
*H04L 1/00*    (2006.01)
(Continued)

(52) U.S. Cl.
CPC .............. *H04L 5/0053* (2013.01); *H04J 1/00* (2013.01); *H04L 1/001* (2013.01); *H04L 1/0073* (2013.01);
(Continued)

(58) Field of Classification Search
CPC ..... H04L 5/0053; H04L 5/001; H04L 5/0055; H04L 5/0057; H04L 1/001; H04L 1/1861;
(Continued)

(56) References Cited

U.S. PATENT DOCUMENTS 9,258,806 B2    2/2016  Falahati et al.
2008/0225788 A1    9/2008  Inoue et al.
(Continued)

FOREIGN PATENT DOCUMENTS

EP    2398181 A2    12/2011
JP    2008-236018 A    10/2008
(Continued)

OTHER PUBLICATIONS

Written Opinion of International Searching Authority issued in PCT/JP2016/076565, dated Nov. 8, 2016, English Translation (Year: 2016).*

(Continued)

*Primary Examiner* — Joshua Kading
(74) *Attorney, Agent, or Firm* — Osha Bergman Watanabe & Burton LLP

(57) ABSTRACT

The present invention is designed so that, even when the number of component carriers (CC) that can be configured per user terminal is expanded more than in existing systems, UCI including at least HARQ-ACK and CSI can be transmitted with appropriate quality. The user terminal of the present invention separately encodes at least one CC's HARQ-ACK and at least one CC's CSI. The user terminal maps the encoded bit sequence of the HARQ-ACK and the encoded bit sequence of the CSI to radio resources constituting the same PUCCH and transmits the PUCCH.

9 Claims, 12 Drawing Sheets

(51) Int. Cl.

| | | |
|---|---|---|
| *H04L 1/18* | (2006.01) | |
| *H04W 72/04* | (2009.01) | |
| *H04W 72/02* | (2009.01) | |
| *H04J 1/00* | (2006.01) | |
| *H04J 11/00* | (2006.01) | |
| *H04W 72/12* | (2009.01) | |
| *H03M 13/23* | (2006.01) | |

(52) U.S. Cl.
 CPC .......... *H04L 1/0081* (2013.01); *H04L 1/1861* (2013.01); *H04L 5/001* (2013.01); *H04L 5/0055* (2013.01); *H04L 5/0057* (2013.01); *H04W 72/02* (2013.01); *H04W 72/04* (2013.01); *H04W 72/0413* (2013.01); *H03M 13/23* (2013.01); *H04J 11/00* (2013.01); *H04W 72/1278* (2013.01)

(58) Field of Classification Search
 CPC ..... H04L 1/0073; H04L 1/0081; H04L 27/01; H04W 72/0413; H04W 72/04; H04W 72/02; H04W 72/1278; H04J 1/00; H04J 11/00; H03M 13/23
 See application file for complete search history.

(56) References Cited

U.S. PATENT DOCUMENTS

| | | | | |
|---|---|---|---|---|
| 2011/0243066 | A1* | 10/2011 | Nayeb Nazar | H04L 1/007 370/328 |
| 2011/0249578 | A1 | 10/2011 | Nayeb Nazar et al. | |
| 2011/0310986 | A1 | 12/2011 | Heo et al. | |
| 2013/0077595 | A1* | 3/2013 | Aiba | H04L 5/001 370/329 |
| 2013/0114554 | A1* | 5/2013 | Yang | H04W 24/10 370/329 |
| 2013/0195035 | A1* | 8/2013 | Taoka | H04B 7/0478 370/329 |
| 2013/0301550 | A1* | 11/2013 | Kim | H04W 72/02 370/329 |
| 2014/0078974 | A1* | 3/2014 | Falahati | H04L 5/0055 370/329 |
| 2014/0233419 | A1* | 8/2014 | Cheng | H04L 1/0031 370/252 |
| 2014/0369294 | A1* | 12/2014 | Seo | H04W 76/10 370/329 |
| 2016/0056942 | A1* | 2/2016 | Wang | H04L 5/0048 370/330 |
| 2016/0183244 | A1* | 6/2016 | Papasakellariou | H04L 5/0057 370/329 |
| 2018/0145817 | A1* | 5/2018 | Papasakellariou | H04L 5/001 |
| 2018/0167931 | A1* | 6/2018 | Papasakellariou | H04L 5/0053 |
| 2018/0198568 | A1* | 7/2018 | Takeda | H03M 13/15 |
| 2018/0198569 | A1* | 7/2018 | Lyu | H04B 7/0626 |
| 2018/0249458 | A1* | 8/2018 | He | H04L 1/1607 |
| 2019/0141722 | A1 | 5/2019 | Nayeb Nazar et al. | |
| 2019/0280801 | A1* | 9/2019 | Gao | H04L 5/0048 |

FOREIGN PATENT DOCUMENTS

| | | | | | |
|---|---|---|---|---|---|
| JP | 2008236018 | A | * | 10/2008 | .......... H04L 1/0006 |
| JP | 2009-164815 | A | | 7/2009 | |
| JP | 2009164815 | A | * | 7/2009 | ............ H04W 18/02 |
| JP | 2013513921 | A | * | 4/2013 | |
| JP | 2014531825 | A | * | 11/2014 | ............... H04L 1/16 |
| JP | 2015-092716 | A | | 5/2015 | |
| JP | 2015092716 | A | * | 5/2015 | ........... H04L 1/0027 |
| JP | 2015-523831 | A | | 8/2015 | |
| JP | 2015523831 | A | * | 8/2015 | ............ H04W 52/18 |
| WO | WO-2015050743 | A1 | * | 4/2015 | .......... H04W 72/082 |

OTHER PUBLICATIONS

NEC Group, Multiplexing of uplink data-non-associated control signal without data, 3GPP TSG-RAN WG1#49b R1-072834 Jun. 20, 2007 (Year: 2007).*
International Search Report issued in PCT/JP2016/076565 dated Nov. 8, 2016 (1 page).
Written Opinion of the International Searching Authority issued in PCT/JP2016/076565 dated Nov. 8, 2016 (4 pages).
3GPP TS 36300 V8.12.0; "3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 8)"; Mar. 2010 (149 pages).
Extended European Search Report issued in the counterpart European Patent Application No. 16848512.6, dated Apr. 30, 2019 (8 pages).
Huawei, HiSilicon; "Periodic CSI feedback enhancement for carrier aggregation enhancement beyond 5 carriers"; 3GPP TSG RAN WG1 Meeting #82 R1-153773; Beijing, China, Aug. 24-28, 2015 (6 pages).
Office Action issued in the counterpart Japanese Patent Application No. 2017-541515, dated Jan. 28, 2019 (16 pages).
NEC Group; "Multiplexing of uplink data-non-associated control signal without data"; 3GPP TSG RAN WG1 Meeting #49bis, R1-072834; Orlando, USA; Jun. 25-29, 2007 (3 pages).
Office Action issued in European Application No. 16848512.6; dated Feb. 5, 2020 (6 pages).
Office Action issued in European Application No. 16848512.6, dated Aug. 21, 2020 (8 pages).

\* cited by examiner

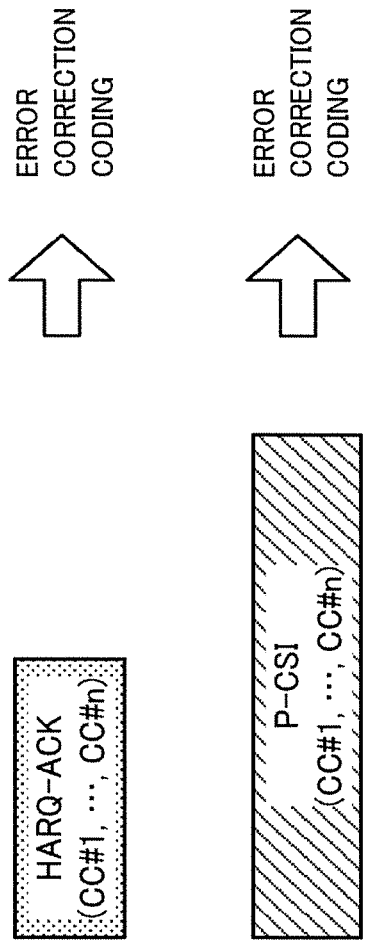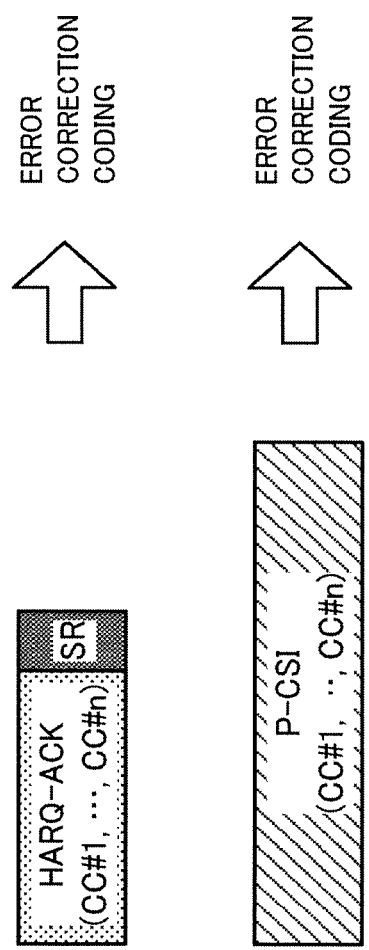
FIG. 3A
FIG. 3B

TERMINAL, BASE STATION AND RADIO COMMUNICATION METHOD FOR SEPARATELY ENCODING UPLINK CONTROL INFORMATION

TECHNICAL FIELD

The present invention relates to a user terminal, a radio base station and a radio communication method in next-generation mobile communication systems.

BACKGROUND ART

In the UMTS (Universal Mobile Telecommunication System) network, the specifications of long term evolution (LTE) have been drafted for the purpose of further increasing high speed data rates, providing lower delays and so on (see non-patent literature 1). LTE Advanced (also referred to as LTE Rel. 10, 11 or 12) is specified for the purpose of further broadbandization and speed-up from LTE (also referred to as LTE Rel. 8), and a successor system (also referred to as LTE Rel. 13 or the like) is also under study.

The system band in LTE Rel. 10/11 includes at least one component carrier (CC), where the LTE system band of LTE Rel. 8 constitutes one unit. Such bundling of a plurality of CCs into a wide band is referred to as "carrier aggregation" (CA).

In LTE of Rel. 8 to 12, the specifications have been drafted assuming exclusive operations in frequency bands that are licensed to operators—that is, licensed bands. For licensed bands, for example, 800 MHz, 2 GHz and/or 1.7 GHz have been in use.

In LTE of Rel. 13 and later versions, operation in frequency bands where license is not required—that is, unlicensed bands—is also a target of study. For unlicensed band, for example, 2.4 GHz, which is the same as in Wi-Fi, or the 5 GHz band and/or the like may be used. Although carrier aggregation (LAA: license-assisted access) between licensed bands and unlicensed bands is placed under study in Rel. 13 LTE, there is a possibility that, in the future, dual connectivity and unlicensed-band stand-alone will becomes targets of study as well.

CITATION LIST

Non-Patent Literature

Non-Patent Literature 1: 3GPP TS 36.300 Rel.8 "Evolved Universal Terrestrial Radio Access (E-UTRA) and Evolved Universal Terrestrial Radio Access Network (E-UTRAN); Overall description; Stage 2"

SUMMARY OF INVENTION

Technical Problem

In the carrier aggregation of LTE Rel. 10-12, the number of component carriers that can be configured per user terminal is limited to maximum five. In CA in and after LTE Rel. 13, a study is in progress to expand the number of CCs that can be configured per user terminal to six or more in order to realize further band expansion.

By the way, in existing systems, Uplink control information (UCI) including at least one of transmission acknowledgment information (HARQ-ACK: Hybrid Automatic Repeat reQuest-ACKnowledgment) for a downlink shared channel (PDSCH: Physical Downlink Shared Channel) of each CC, channel state information (CSI), scheduling request (SR) is transmitted using an uplink control channel (PUCCH: Physical Uplink Control Channel) or an uplink shared channel (PUSCH: Physical Uplink Shared Channel)."

In existing systems, when UCI including at least HARQ-ACK and CSI is transmitted via an uplink control channel (PUCCH), the HARQ-ACK and CSI are regarded as one bit sequence and encoded (joint coding). However, if the number of CCs that can be configured in a user terminal is expanded to six or more and HARQ-ACK and CSI are joint-coded in the same way as in existing systems, there is a risk that the HARQ-ACK and CSI cannot appropriately satisfy different required qualities.

The present invention has been made in view of such points, and it is therefore an object of the present invention to provide a user terminal, a radio base station and a radio communication method whereby UCI including at least HARQ-ACK and CSI can be transmitted with appropriate quality even when the number of component carriers (CC) that can be configured per user terminal is expanded more than in existing systems.

Solution to Problem

According to one aspect of the present invention, a user terminal can configure a plurality of component carriers (CCs), and this user terminal has a coding section that separately encodes transmission acknowledgment information for a downlink shared channel of at least one CC and channel state information of at least one CC, and a transmission section that maps an encoded bit sequence of the transmission acknowledgment information and an encoded bit sequence of the channel state information to radio resources constituting a same uplink control channel to transmit the uplink control channel.

Advantageous Effects of Invention

According to the present invention, even when the number of component carriers (CC) that can be configured per user terminal is expanded more than in existing systems, UCI including at least HARQ-ACK and CSI can be transmitted with appropriate quality.

BRIEF DESCRIPTION OF DRAWINGS

FIGS. 3A and 3B are diagrams to show an example of encoding of UCI according to the present embodiment;

DESCRIPTION OF EMBODIMENTS

Figure 1:
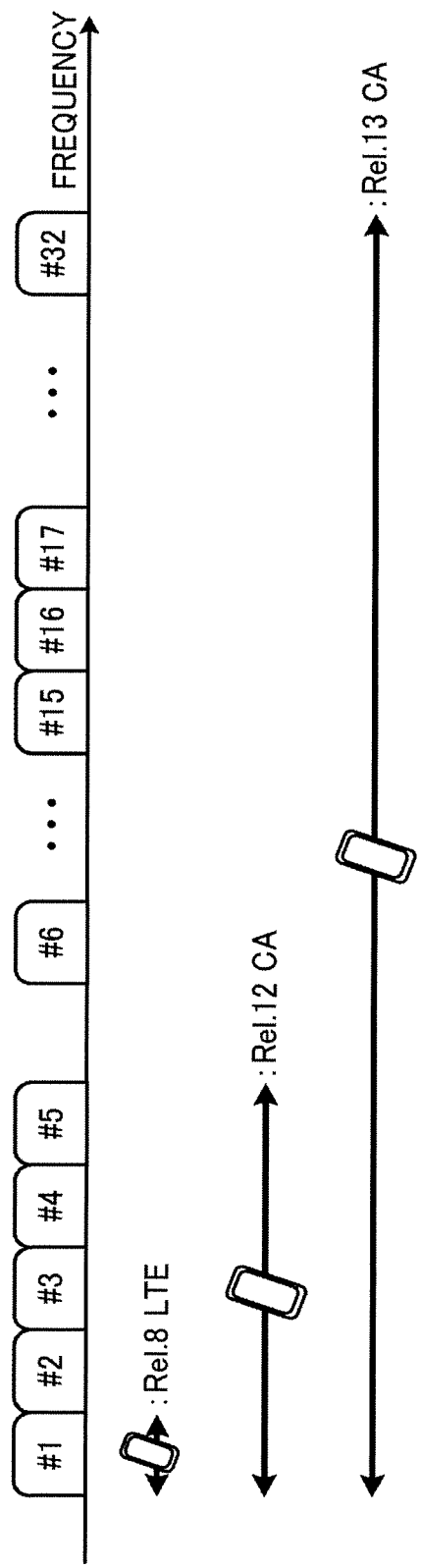
FIG. 1 is a diagram to explain carrier aggregation.

FIG. 1 is a diagram to explain carrier aggregation (CA). As shown in FIG. 1, in CA up to LTE Rel. 12, maximum five component carriers (CCs) (CC #1 to CC #5) are bundled, where the system band of LTE Rel. 8 constitutes one unit. That is, in carrier aggregation up to LTE Rel. 12, the number of CCs that can be configured in a user terminal (UE: User Equipment) is limited to maximum five.

Meanwhile, in carrier aggregation of LTE Rel. 13, a study is in progress to further expand the band by bundling six or more CCs. That is, in CA of LTE Rel. 13, expansion of the number of CCs (cells) that can be configured per user terminal to six or more (CA enhancement) is being studied. For example, as shown in FIG. 1, when 32 CCs (CC #1 to CC #32) are bundled, a bandwidth of maximum 640 MHz can be secured.

In this way, more flexible and faster radio communication is expected to be made possible by increasing the number of CCs that can be configured in a user terminal. Also, expanding the number of CCs like this is an effective way to widen the band based on CA (LAA: License-Assisted Access) between licensed bands and unlicensed bands. For example, five licensed band CCs (=100 MHz) and fifteen unlicensed band CCs (=300 MHz) are bundled, and a bandwidth of 400 MHz can be secured.

Meanwhile, when the number of CCs that can be configured in a user terminal is expanded to six or more (for example, 32), it is difficult to directly apply the transmission methods used in existing systems (Rel. 10 to 12) (for example, PUCCH formats) on an as-is basis.

r example, in the existing system (LTE Rel. 10-12), the user terminal transmits the uplink control information (UCI) by using the uplink control channel (PUCCH). In existing systems, PUCCH formats 1/1a/1b, 2/2a/2b and 3 (collectively referred to as "existing PUCCH formats") are supported as formats for the PUCCH (hereinafter referred to as "PUCCH formats") for transmitting UCI, which includes at least one of HARQ-ACK, CSI and SR.

However, when the number of CCs that can be configured per user terminal is expanded to six or more (for example, 32), PUCCH format 3 may not be able to provide sufficient payload, and it may not be possible to transmit UCI with respect to all the scheduled CCs.

Therefore, PUCCH formats, in which the maximum number of bits (payload, capacity, etc.) that can be transmitted is larger than in existing PUCCH formats, are studied (hereinafter referred to as "new PUCCH formats"). In new PUCCH formats, it is expected that at least one CC's HARQ-ACK and at least one CC's CSI (especially periodic CSI (P-CSI) can be multiplexed at the same time.

Here, if the number of CCs that can be configured per user terminal is expanded, when sending HARQ-ACK for all scheduled CCs, the number of HARQ-ACK bits can take a wide range. For example, if up to 32 CCs can be used, in time division duplex (TDD), the number of bits in HARQ-ACK is at least one bit, at most 128 bits. Also, if frequency division duplex (FDD) is used, the number of HARQ-ACK bits is at least one bit, and maximum 64 bits.

Similarly, when sending P-CSIs of multiple CCs, the number of P-CSI bits can also take a wide range.

For example, if a maximum of 32 CCs can be configured, the number of P-CSI bits is expected to be at least four bits, up to 352 bits.

Therefore, when HARQ-ACK and P-CSI are simultaneously multiplexed in a new PUCCH format, it is expected that the number of HARQ-ACK bits differs greatly from the number of P-CSI bits. For example, a case might occur where P-CSI is four bits while HARQ-ACK is 128 bits, or where P-CSI is 352 bits compared with HARQ-ACK being one bit."

By the way, the importance of UCI differs greatly between HARQ-ACK and P-CSI. Specifically, if HARQ-ACK cannot be correctly transmitted, downlink data cannot be appropriately retransmitted, so the importance of HARQ-ACK is higher than that of P-CSI.

Therefore, it is assumed that the target error rate differs between HARQ-ACK and P-CSI and the required reception quality is different (for example, SINR: Signal-to-Interference plus Noise power Ratio). For example, while the bit error rate (BER) of HARQ-ACK is less than 0.1%, the bit error rate of P-CSI is required to be less than 1%.

Figures 2A, 2B:
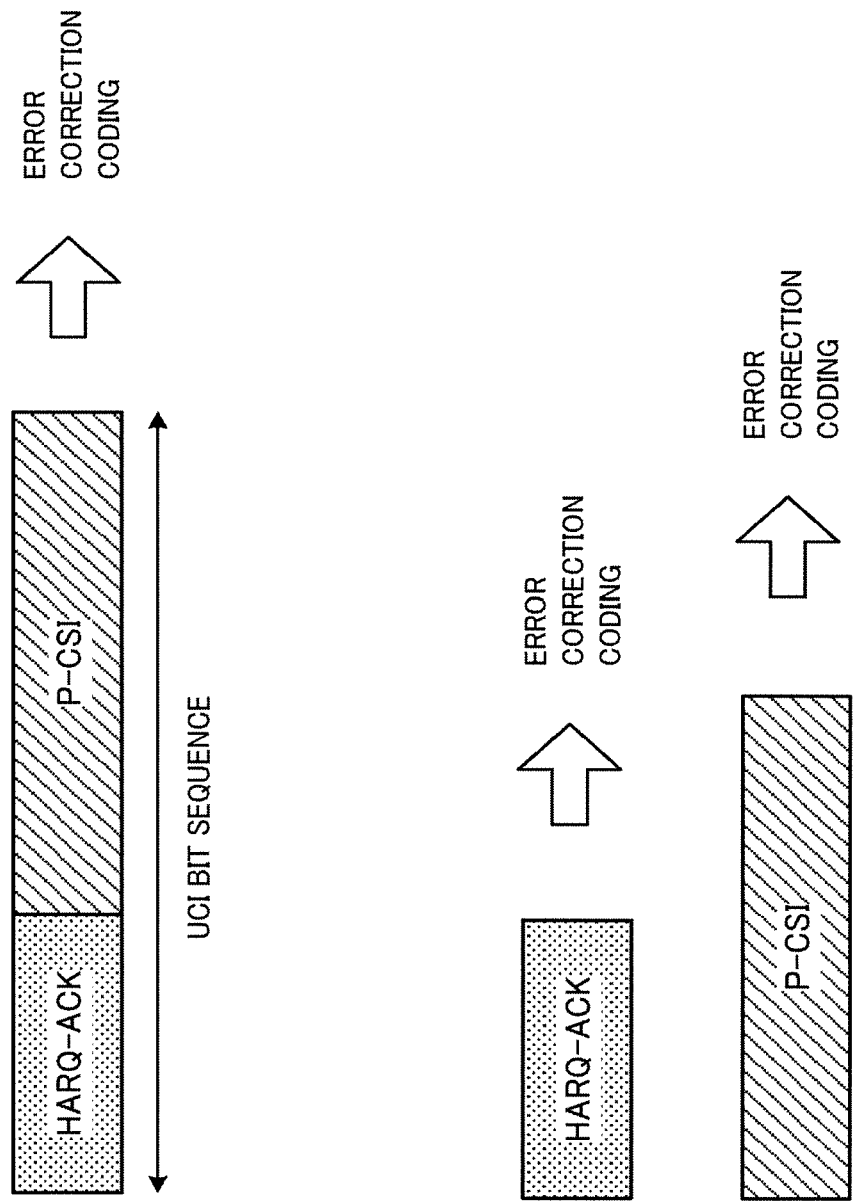
FIGS. 2A and 2B are diagrams to show an example of encoding of UCI.

FIG. 2 is a diagram showing an example of encoding of UCI. In FIG. 2A, an example is shown in which at least one CC's HARQ-ACK and at least one CC's P-CSI are jointly encoded. On the other hand, FIG. 2B shows an example in which at least one CC's HARQ-ACK and at least one CC's P-CSI are subjected to separate encoding.

As shown in FIG. 2A, in joint coding, HARQ-ACK and P-CSI are combined and regarded as one bit sequence and error correction coding is applied. Error correction coded bit sequence is modulated into data symbols using a modulation scheme such as PSK (Phase Shift Keying) or QAM (Quadrature Amplitude Modulation) and mapped to resource elements (RE). In addition, when multiple user terminals are code division multiplexed (CDM), spreading processing is performed.

In the joint coding shown in FIG. 2A, the final coding rate is determined based on the sum of the numbers of both HARQ-ACK and P-CSI bits and the payload in PUCCH format. On the other hand, since the required quality is different between HARQ-ACK and P-CSI, there is a fear that it is not possible to select an appropriate encoding rate as a whole. In particular, there is a fear that, when attempting to achieve the required quality of HARQ-ACK, P-CSI becomes excessive quality, and, when trying to match the required quality of P-CSI, the required quality of HARQ-ACK cannot be achieved.

On the other hand, as shown in FIG. 2B, error correction coding is separately applied to the bit sequence of HARQ-ACK and the P-CSI bit sequence in separate encoding. In the separate encoding shown in FIG. 2B, since error correction coding is performed with HARQ-ACK and P-CSI at appropriate coding rates, different required qualities of HARQ-ACK and P-CSI can be met appropriately.

Therefore, the present inventors have come up with the idea of multiplexing HARQ-ACK and P-CSI, encoded separately, in a new PUCCH format, at the same time, so that different required qualities of HARQ-ACK and P-CSI are appropriately met, and reached the present invention.

In one example of the present invention, a user terminal that can configure multiple CCs separately encodes HARQ-ACK for the PDSCH of at least one CC and CSI of at least one CC. Also, in the user terminal, the encoded bit sequence of the HARQ-ACK and the encoded CSI bit sequence are mapped to radio resources constituting the same PUCCH and transmitted.

According to one example of the present invention, since HARQ-ACK and CSI are separately encoded, as a result of this, different required qualities of HARQ-ACK and P-CSI can be satisfied appropriately and UCI including at least HARQ-ACK and CSI can be transmitted on the same PUCCH.

(Radio Communication Method)

Now, the radio communication method according to an embodiment of the present invention will be described. In the following, UCI including at least HARQ-ACK and CSI is transmitted using a new PUCCH format, but this is not limiting. For example, when existing PUCCH format 3 is used, the radio communication method according to the present embodiment may be applied.

In addition, the new PUCCH formats shown below are merely examples, and are by no means limiting. For example, the number and positions of demodulation reference signals (DM-RS) are not limited to those shown below. For example, in a new PUCCH format, reference signals (for example, SRS (Sounding Reference Signal)) other than the DMRS may be arranged. In addition, a new PUCCH format may be referred to as "PUCCH format 4," "large capacity PUCCH format," "enhanced PUCCH format," "new format," and the like.

In the following description, periodic CSI (P-CSI) is assumed, but CSI is not limited to P-CSI, and aperiodic CSI (A-CSI: A-CSI) may be used.

<Coding Example>

An example of encoding in the radio communication method according to the present embodiment will be described. In the present embodiment, a user terminal that can configure multiple CCs separately encodes at least one CC's P-CSI and at least one CC's CSI.

FIG. 3 is a diagram showing an example of encoding of UCI according to the present embodiment. In FIG. 3A, an example of encoding in the case where UCI including at least one CC's HARQ-ACK and at least one CC's P-CSI is transmitted in a new PUCCH format is shown. As shown in FIG. 3A, the user terminal encodes at least one CC's HARQ-ACK as one bit sequence and treats it as one codeword (CW). Also, the user terminal encodes at least one CC's P-CSI as one bit sequence and treats it as one codeword.

In FIG. 3B, an example of coding in the case where UCI including at least one CC's HARQ-ACK and SR and at least one CC's P-CSI is transmitted in a new PUCCH format is shown. As shown in FIG. 3B, the user terminal encodes at least one CC's HARQ-ACK and SR (for example, one bit) as one bit sequence and treats it as one codeword.

In FIGS. 3A and 3B, when the bit length (the number of bits) of HARQ-ACK (or HARQ-ACK and SR) exceeds a predetermined threshold value, the user terminal may add a cyclic redundancy check (CRC) bit to the bit sequence of HARQ-ACK (or HARQ-ACK and SR). Likewise, if the bit length (the number of bits) of P-CSI exceeds a predetermined threshold, the user terminal may add a CRC bit to the P-CSI bit sequence.

Further, in FIG. 3A and FIG. 3B, different coding schemes may be applied depending on the bit length of HARQ-ACK (or HARQ-ACK and SR) and P-CSI, respectively. For example, when the bit length is equal to or less than a predetermined threshold, encoding may be performed using convolutional code, and, if the bit length exceeds a predetermined threshold, encoding may be performed using turbo code. If the bit length after encoding is smaller than the amount (payload) of the PUCCH resource to be transmitted, iteration code may be applied to the resulting encoded bit sequence. Conversely, when the bit length after encoding is larger than the amount (payload) of the PUCCH resource to be transmitted, puncturing of the parity bit sequence may be applied to the obtained encoded bit sequence. Also, the number of CRC bits, channel interleaving, etc. may be changed according to the encoding method to be applied.

<Mapping Example>

Next, a mapping example in the radio communication method according to the present embodiment will be described. Hereinafter, in the present embodiment, "HARQ-ACK (and SR)" shall generically referred to "at least one CC's HARQ-ACK" shown in FIG. 3A and "at least one CC's HARQ-ACK and SR" shown in FIG. 3B. In the following, "P-CSI" is a generic term for "at least one CC's P-CSI" shown in FIGS. 3A and 3B.

In the present embodiment, as described above, in the user terminal, an encoded HARQ-ACK (and SR) bit sequence and an encoded CSI bit sequence, encoded separately, are mapped to radio resources (for example, resource elements (RE)) making up the same PUCCH, and transmitted.

FIG. 4 is a diagram to show an example of a new PUCCH format according to the present embodiment. In the new PUCCH format shown in FIG. 4, the DM-RS is placed in the fourth SC-FDMA symbol in each slot in the subframe. Further, the new PUCCH format shown in FIG. 4 may be composed of one physical resource block (PRB) or a plurality of PRBs. Note that the configuration of the new PUCCH format shown in FIG. 4 is merely an example, and this is by no means limiting.

Figure 4A:
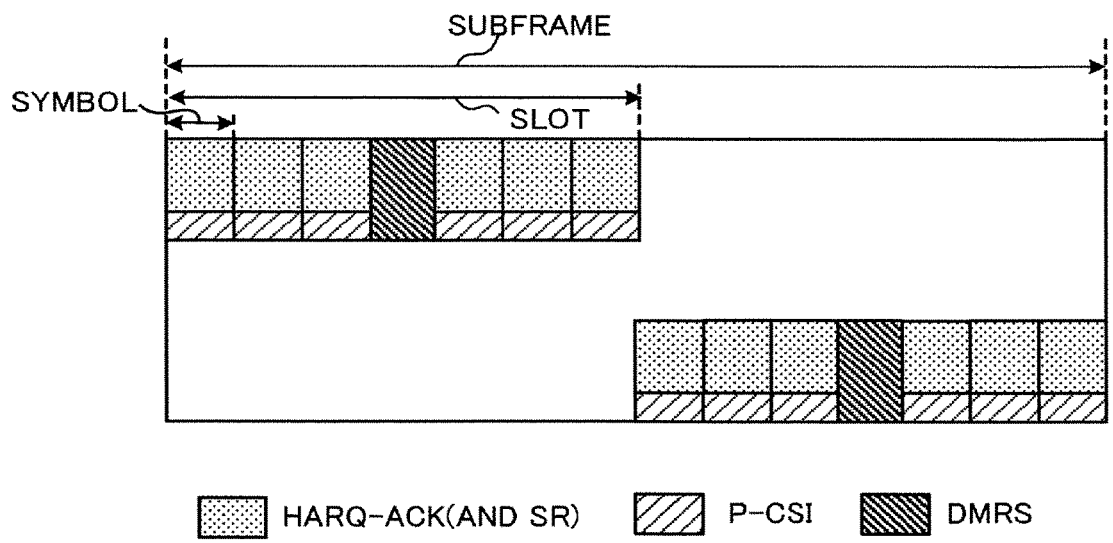
FIG. 4 is a diagram to show an example of a new PUCCH format according to the present embodiment.

In FIG. 4A, an example is shown in which encoded HARQ-ACK (and SR) bit sequence and encoded P-CSI bit sequence are multiplexed in the same SC-FDMA symbol. As shown in FIG. 4A, the user terminal may map the encoded HARQ-ACK (and SR) bit sequence and the encoded P-CSI bit sequence to the same SC-FDMA symbol.

Specifically, in the user terminal, the encoded HARQ-ACK (and SR) bit sequence and the encoded P-CSI bit sequence are modulated separately into data symbols using a predetermined modulation scheme (for example, QPSK (Quadrature Phase Shift Keying)). At the user terminal, the modulated HARQ-ACK (and SR) symbol and the modulated CSI symbol are multiplexed, mapped to all SC-FDMA symbols except the SC-FDMA symbol on which the DM-RS is allocated, and discrete Fourier transform (DFT: Discrete Fourier Transform) is performed.

In this way, in FIG. 4A, the encoded HARQ-ACK (and SR) bit sequence and the encoded P-CSI bit sequence, after being multiplexed in the same SC-FDMA symbol, and converted from time domain symbols to a frequency domain signal. For this reason, HARQ-ACK (and SR) and P-CSI will be mixed in the frequency domain.

Figure 4B:
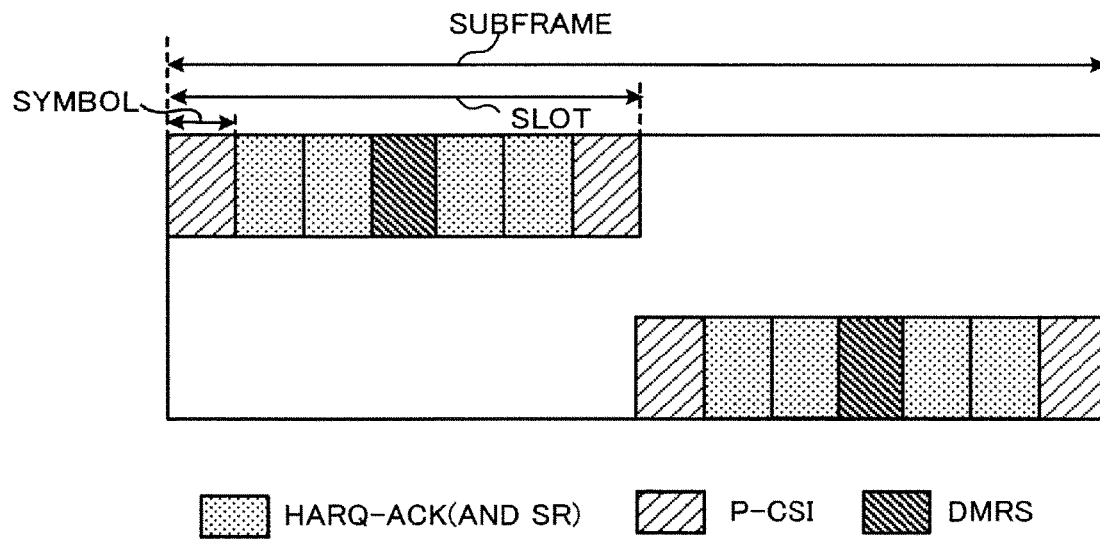

On the other hand, FIG. 4B shows an example in which encoded HARQ-ACK (and SR) bit sequence and encoded P-CSI bit sequence are multiplexed between different SC-FDMA symbols. As shown in FIG. 4B, the user terminal may map an encoded HARQ-ACK (and SR) bit sequence and an encoded P-CSI bit sequence to different SC-FDMA symbols in the new PUCCH format.

In particular, the user terminal modulates encoded HARQ-ACK (and SR) bit sequence and encoded P-CSI bit sequence into different data symbols using a predetermined modulation scheme (for example, QPSK). The user terminal maps modulated HARQ-ACK (and SR) symbols and modulated CSI symbols to different SC-FDMA symbols.

For example, in FIG. 4B, the user terminal maps the modulated HARQ-ACK (and SR) symbol to a predetermined number of SC-FDMA symbols (here, four SC-FDMA symbols) near the SC-FDMA symbol to which the DM-RS is mapped in each slot. On the other hand, the user terminal maps the modulated P-CSI symbol to a predetermined number of SC-FDMA symbols (here, two SC-FDMA symbols) away from the SC-FDMA symbol to which the DM-RS is mapped in each slot.

In this way, in FIG. 4B, an encoded HARQ-ACK (and SR) bit sequence and an encoded P-CSI bit sequence are mapped to SC-FDMA symbols different from each other, and by DFT, converted from time domain symbols to a frequency domain signal. For this reason, HARQ-ACK (and SR) and P-CSI are not mixed in the frequency domain.

<Terminal Control Example>

Next, a terminal control example in the radio communication method according to the present embodiment will be described in detail.

In this embodiment, the user terminal receives information indicating the transmission cycle and transmission timing of P-CSI of each CC (for example, offset with respect to the beginning of the subframe) by way of higher layer signaling. The user terminal transmits the P-CSI of each CC using the PUCCH at the transmission cycle and transmission timing.

When the user terminal transmits HARQ-ACK (and SR) in a transmission subframe of P-CSI of a predetermined cycle, as described above, HARQ-ACK (and SR) and P-CSI are separately coded and multiplexed in a new PUCCH format.

In the present embodiment, when transmitting HARQ-ACK in a transmission subframe of P-CSI of a predetermined period, the user terminal does not control to drop a bit sequence of HARQ-ACK (and SR). On the other hand, the user terminal may drop at least a part of the PSI bit sequence before encoding, based on predetermined conditions. Conditions 1 to 3 for dropping the PSI bit sequence before encoding will be described in detail. FIG. 5 is a diagram for explaining conditions for dropping P-CSI. Note that FIG. 5 is merely an example, and this is by no means limiting.

<Condition 1>

When the bit length of P-CSI before encoding exceeds a predetermined threshold, or when the number of P-CSI CCs exceeds a predetermined threshold value, the user terminal may drop a P-CSI bit sequence that exceeds a predetermined threshold. Here, the predetermined threshold value is, for example, the maximum bit length of P-CSI before encoding or the maximum number of P-CSI CCs that can be multiplexed in the new PUCCH format, and the threshold value may be preconfigured in the user terminal by higher layer signaling from the radio base station (for example, RRC (Radio Resource Control) signaling or broadcast information).

Figure 5A:
FIGS. 5A to 5C are diagrams to explain conditions for dropping P-CSI according to the present embodiment.
Figure 5A:
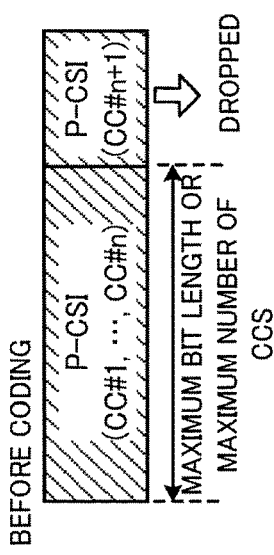

For example, in FIG. 5A, since the bit length of P-CSI before encoding exceeds the maximum bit length (the bit length of the P-CSIs of CC #1 to #n), or the number of P-CSI CCs is the maximum number of CCs (n pieces), the user terminal drops the P-CSI corresponding to CC #n+1.

<Condition 2>

If the bit length of P-CSI after encoding and/or parity puncturing exceeds a predetermined threshold value, the user terminal may drop at least a part of the pre-encoding PSI bit sequence such that the bit length after encoding and/or parity puncturing does not exceed a predetermined threshold.

Figure 5B:
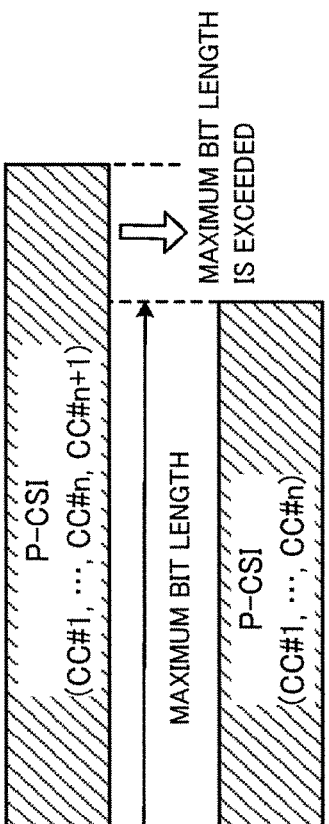
Figure 5B:
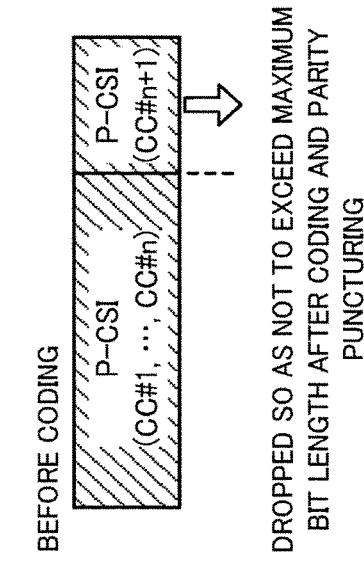

For example, in FIG. 5B, the user terminal determines whether the bit length of P-CSI after coding and/or parity puncturing corresponding to CC #1 to CC #n+1 is smaller than a predetermined threshold value (the maximum bit length), the user terminal drops the P-CSI corresponding to CC #n+1 before encoding. In FIG. 5B, when the user terminal determines whether or not the bit length of the P-CSI exceeds a predetermined threshold value, P-CSI corresponding to CC #1 to CC #n+1 may not be actually encoded and/or parity-punctured. The user terminal may estimate the bit length after encoding and/or parity puncturing based on the bit length and coding rate before encoding, and determines whether the bit length exceeds the predetermined threshold.

Here, the predetermined threshold value is, for example, the maximum bit length after P-CSI encoding and/or parity puncture, and may be configured in the user terminal by higher layer signaling, or may be calculated in the user terminal. As described with reference to FIG. 6, the user terminal may calculate the maximum bit length based on at least one of the ratio of the P-CSI payload to the maximum payload in new PUCCH format, the number of SC-FDMA symbols for P-CSI, and the number of subcarriers for P-CSI (or the number of PRBs).

Figure 6A:
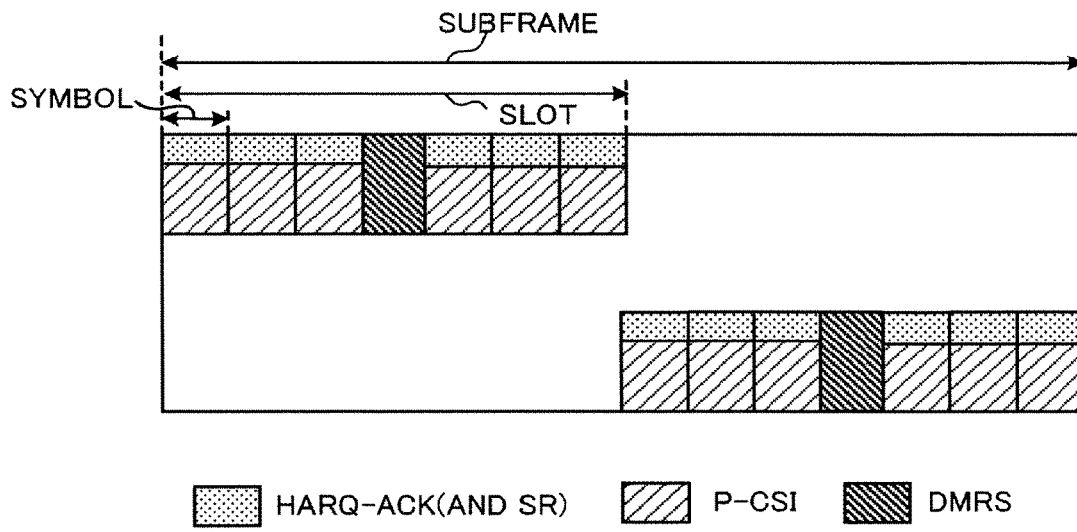
FIGS. 6A and 6B are diagrams to show another example of a new PUCCH format according to the present embodiment.
Figure 6B:
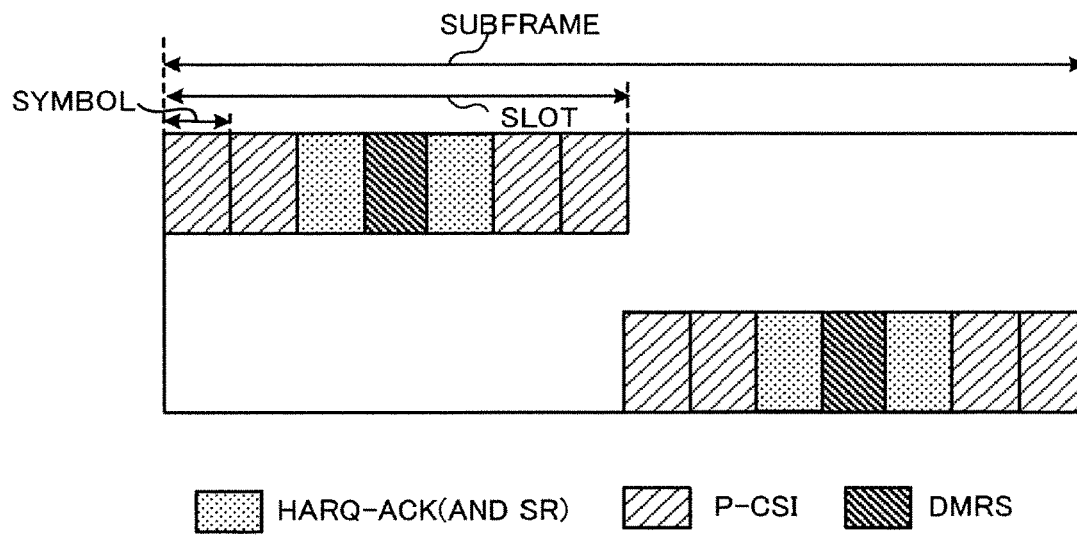

FIG. 6 provide diagrams, each showing another example of a new PUCCH format according to the present embodiment. FIG. 6A shows a modification of FIG. 4A, and FIG. 6B shows a modification of FIG. 4B.

In the new PUCCH format shown in FIG. 6A, to P-CSI, more subcarriers (or PRBs) are assigned than in FIG. 4A. For example, in FIG. 4A, ⅓ of all subcarriers (or PRBs) constituting the new PUCCH format are allocated to P-CSI, and, on the other hand, in FIG. 6A, ⅔ of all subcarriers (or PRBs) are allocated to P-CSI.

In FIG. 6A, the user terminal may calculate the maximum bit length based on the number of P-CSI subcarriers (or the number of PRBs). The number of subcarriers to be allocated to P-CSI (or the number of PRBs) may be configured in the user terminal in advance, or may be configured in the user terminal by higher layer signaling.

Alternatively, in FIG. 6A, the user terminal may calculate the maximum bit length based on the ratio of the number of P-CSI subcarriers (or the number of PRBs) to the number of all subcarriers in the new PUCCH format (or the total number of PRBs) (that is, the ratio of the P-CSI payload to the maximum payload). The ratio may be preconfigured in the user terminal, configured in the user terminal by higher layer signaling, or calculated in the user terminal based on the number of sub-carriers for P-CSI (or the number of PRBs).

On the other hand, in the new PUCCH format shown in FIG. 6B, more SC-FDMA symbols are assigned to P-CSI than in FIG. 4B. For example, in FIG. 4B, two SC-FDMA symbols are assigned to P-CSI in each slot, and, in contrast, in FIG. 6B, four SC-FDMA symbols are assigned to P-CSI in each slot.

In FIG. 6B, the user terminal may calculate the maximum bit length based on the number of SC-FDMA symbols for P-CSI. The number of SC-FDMA symbols for P-CSI may be configured in the user terminal in advance, or it may be configured in the user terminal by higher layer signaling.

Alternatively, in FIG. 6B, the user terminal may calculate the maximum bit length based on the ratio of the number of SC-FDMA symbols for P-CSI to the number of all SC- FDMA symbols in the new PUCCH format (that is, the ratio of the P-CSI payload to maximum payload). The ratio may be configured in advance in the user terminal, configured in the user terminal by higher layer signaling, or may be calculated in the user terminal based on the number of SC-FDMA symbols for P-CSI.

<Condition 3>

Also, when the coding rate of P-CSI exceeds a predetermined threshold, the user terminal selects at least the PSI bit sequence before encoding such that the P-CSI coding rate does not exceed a predetermined threshold.

Figure 5C:
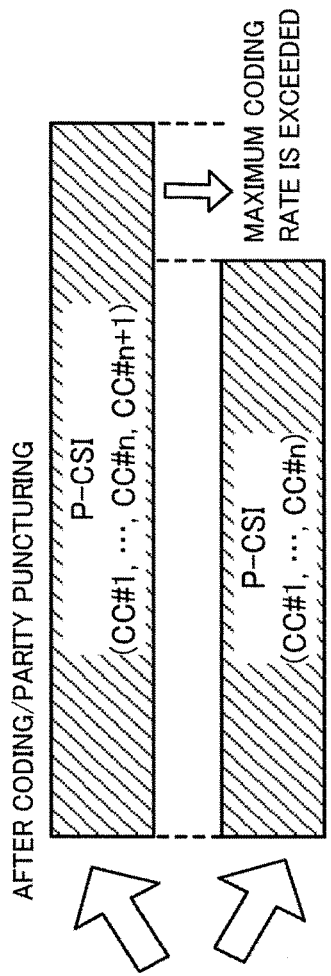
Figure 5C:
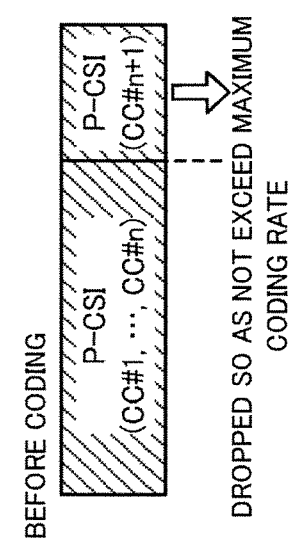

For example, in FIG. 5C, when P-CSIs corresponding to CC #1 to CC #n+1 are encoded, the coding rate exceeds a predetermined threshold (here, the maximum coding rate), so that the user terminal drops the P-CSI corresponding to CC #n+1 before encoding. Note that in FIG. 5C, when the user terminal determines whether or not the coding rate of P-CSI exceeds a predetermined threshold, the P-CSIs corresponding to CC #1 to CC #n+1 do not need to be actually encoded. The user terminal may estimate the coding rate based on the bit length before encoding and determine whether the coding rate exceeds the predetermined threshold or not.

Here, the predetermined threshold value is, for example, the maximum coding rate of P-CSI, and may be configured in the user terminal by high layer signaling or calculated in the user terminal. As described in condition 2 above, the user terminal may calculate the maximum coding rate based on at least one of the ratio of the P-CSI payload to maximum payload in new PUCCH format, the number of SC-FDMA symbols for P-CSI and the number of subcarriers for P-CSI (or the number of PRBs).

For example, in FIG. 6A, the user terminal may calculate the maximum coding rate based on the number of P-CSI subcarriers (or the number of PRBs). Alternatively, the user terminal may calculate the maximum coding rate based on the ratio of the number of P-CSI subcarriers (or the number of PRBs) to the number of all subcarriers in the new PUCCH format (or the total number of PRBs) (that is, the ratio of the P-CSI payload to the maximum payload).

Also, in FIG. 6B, the user terminal may calculate the maximum coding rate based on the number of SC-FDMA symbols for P-CSI. Alternatively, in FIG. 6B, the user terminal may calculate the maximum coding rate based on the ratio of the number of SC-FDMA symbols for P-CSI to the total number of all SC-FDMA symbols in the new PUCCH format (that is, the maximum ratio of P-CSI payload to payload).

As described above, in the present embodiment, the user terminal may perform encoding after dropping at least a part of the PSI bit sequences before encoding based on predetermined conditions. When the total bit length (number of bits) of the encoded HARQ-ACK (and SR) bit sequence and the encoded P-CSI bit sequence exceeds the maximum payload of the new PUCCH format, at least one of the encoded HARQ-ACK (and SR) bit sequence and the encoded P-CSI bit sequence is punctured and mapped (multiplexed) in the new PUCCH format in accordance with the maximum payload.

On the other hand, when the total bit length (the number of bits) of the encoded HARQ-ACK (and SR) bit sequence and the encoded P-CSI bit sequence is less than the maximum payload of the new PUCCH format, at least one of the encoded HARQ-ACK (and SR) bit sequence and the encoded P-CSI bit sequence is repeated and mapped (multiplexed) to the new PUCCH format in accordance with the maximum payload (repetition).

<Other Mapping Examples>

Next, other mapping examples in the radio communication method according to the present embodiment will be described. In the new PUCCH formats shown in FIGS. 4 and 6, although the encoded HARQ-ACK (and SR) bit sequence and the encoded CSI bit sequence are separated at the data symbol position or the SC-FDMA symbol position, they may not be strictly separated (subcarrier position or PRB positions).

Figure 7A:
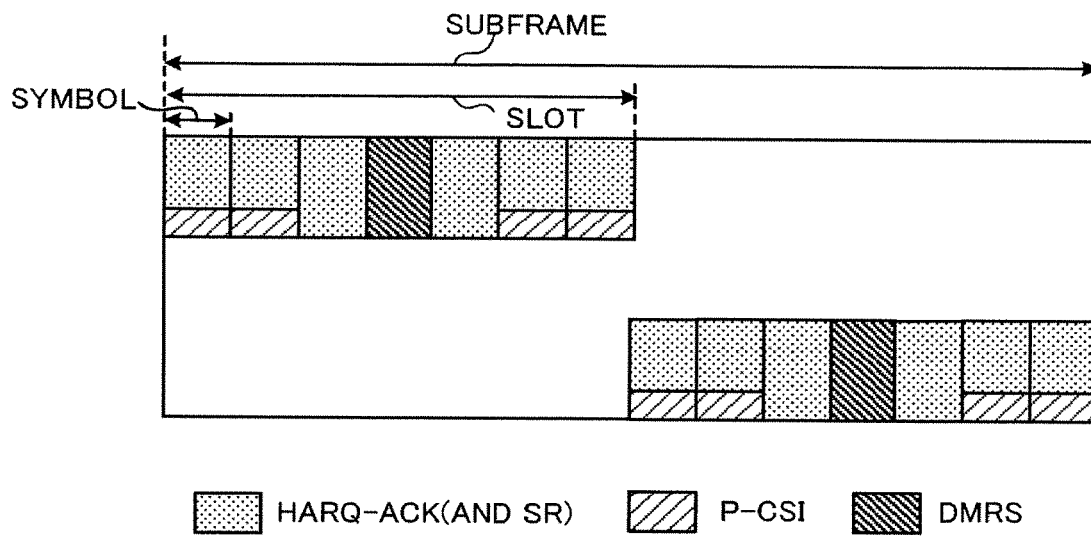
FIGS. 7A and 7B are diagrams to show still another example of a new PUCCH format according to the present embodiment.
Figure 7B:
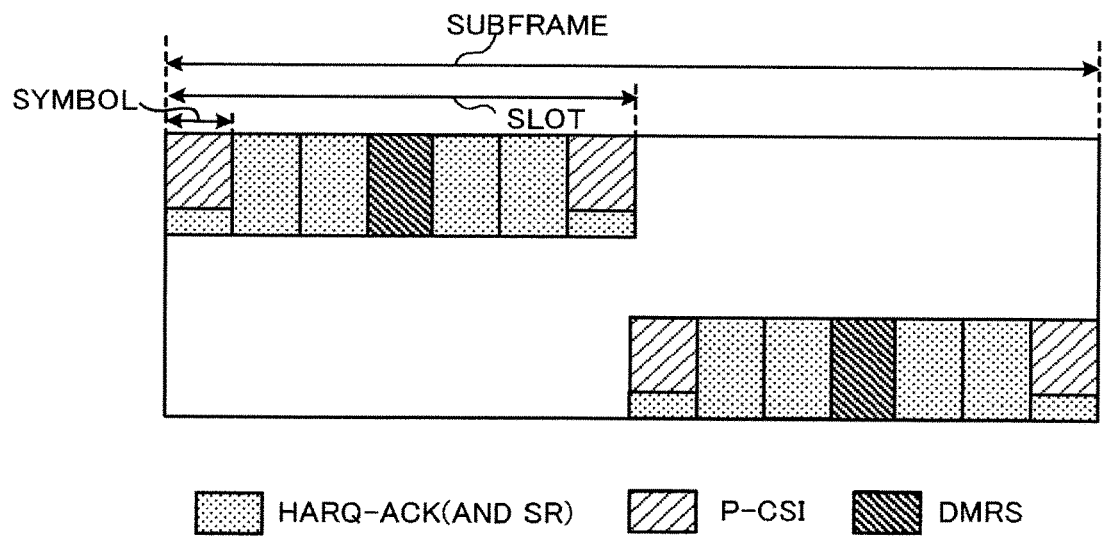

FIG. 7 is a diagram to show another example of a new PUCCH format according to the present embodiment. FIG. 7A shows a modification of FIG. 4A, and FIG. 7B shows a modification of FIG. 4B.

When an encoded HARQ-ACK (and SR) bit sequence and an encoded P-CSI bit sequence are multiplexed in the same SC-FDMA symbol (see FIG. 4A), the user terminal may independently map the encoded HARQ-ACK (and SR) bit sequence or the encoded P-CSI bit sequence to some SC-FDMA symbols.

For example, in FIG. 7A, in each slot, the encoded HARQ-ACK (and SR) bit sequence is mapped to a predetermined number (here, two) of SC-FDMA symbols near the DM-RS without being multiplexed with the encoded P-CSI bit sequence. This can increase the amount of HARQ-ACK (and SR) transmitted while improving the quality of HARQ-ACK (and SR), which is more important than P-CSI.

On the other hand, when the encoded HARQ-ACK (and SR) bit sequence and the encoded P-CSI bit sequence are multiplexed in different SC-FDMA symbols (see FIG. 4B), the user terminal may map both the encoded HARQ-ACK (and SR) bit sequence and the encoded P-CSI bit sequence to some SC-FDMA symbols.

For example, in FIG. 7B, in each slot, at the user terminal, both the encoded HARQ-ACK (and SR) bit sequence and the encoded P-CSI bit sequence are mapped to a predetermined number (here two) of SC-FDMA symbols away from the DM-RS. By doing this, the amount of HARQ-ACK (and SR) to be transmitted can be increased.

In FIGS. 7A and 7B, the radio resource for mapping the encoded HARQ-ACK (and SR) bit sequence (that is, which subcarriers (PRB) of which SC-FDMA symbol the encoded HARQ-ACK (and SR) bit sequence may be mapped) may be preconfigured in the user terminal, configured in the user terminal by higher layer signaling, or may be determined by the user terminal.

When the user terminal determines the radio resource, the user terminal determines the radio resource according to a predetermined pattern based on the number of bits before or after encoding of HARQ-ACK (and SR).

(Radio Communication System)

Now, the structure of the radio communication system according to the present embodiment will be described below. In this radio communication system, the radio communication method is applied. Note that the radio communication methods of the above-described embodiment may be applied individually or may be applied in combination.

Figure 8:
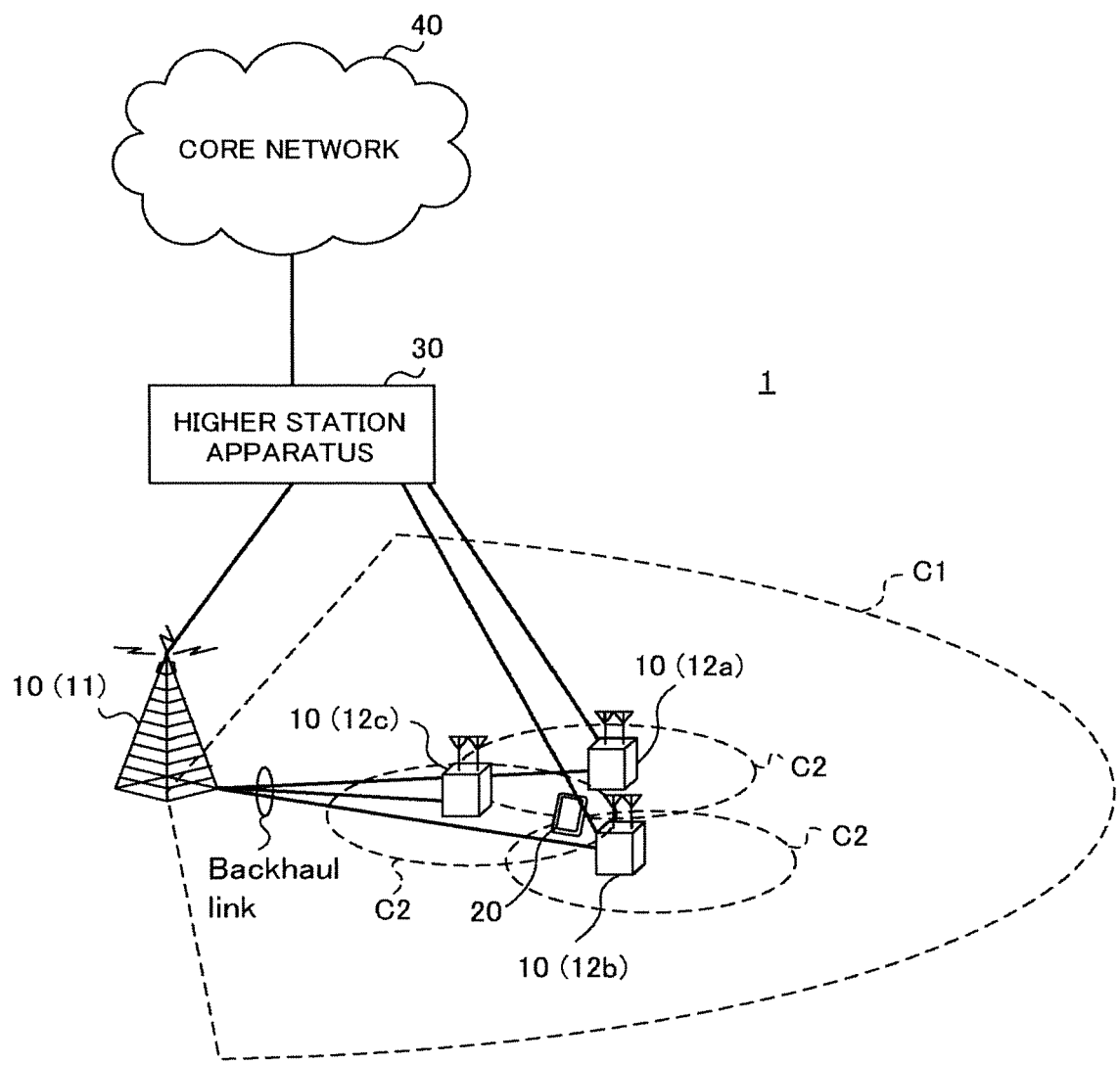
FIG. 8 is a diagram to show an example of a schematic structure of a radio communication system according to an embodiment of the present invention.

FIG. 8 is a diagram to show an example of a schematic structure of a radio communication system according to an embodiment of the present invention. The radio communication system 1 can adopt carrier aggregation (CA) and/or dual connectivity (DC) to group a plurality of fundamental frequency blocks (component carriers) into one, where the LTE system bandwidth (for example, 20 MHz) constitutes one unit. Note that the radio communication system 1 may be referred to as "SUPER 3G," "LTE-A" (LTE-Advanced), "IMT-Advanced," "4G," "5G," "FRA" (Future Radio Access) and so on.

The radio communication system 1 shown in FIG. 8 includes a radio base station 11 that forms a macro cell C1, and radio base stations 12a to 12c that form small cells C2, which are placed within the macro cell C1 and which are narrower than the macro cell C1. Also, user terminals 20 are placed in the macro cell C1 and in each small cell C2.

The user terminals 20 can connect with both the radio base station 11 and the radio base stations 12. The user terminals 20 may use the macro cell C1 and the small cells C2, which use different frequencies, at the same time, by means of CA or DC. Also, the user terminals 20 can execute CA or DC by using a plurality of cells (CCs) (for example, six or more CCs).

Between the user terminals 20 and the radio base station 11, communication can be carried out using a carrier of a relatively low frequency band (for example, 2 GHz) and a narrow bandwidth (referred to as, for example, an "existing carrier," a "legacy carrier" and so on). Meanwhile, between the user terminals 20 and the radio base stations 12, a carrier of a relatively high frequency band (for example, 3.5 GHz, 5 GHz and so on) and a wide bandwidth may be used, or the same carrier as that used in the radio base station 11 may be used. Note that the configuration of the frequency band for use in each radio base station is by no means limited to these.

A structure may be employed here in which wire connection (for example, means in compliance with the CPRI (Common Public Radio Interface) such as optical fiber, the X2 interface and so on) or wireless connection is established between the radio base station 11 and the radio base station 12 (or between two radio base stations 12).

The radio base station 11 and the radio base stations 12 are each connected with a higher station apparatus 30, and are connected with a core network 40 via the higher station apparatus 30. Note that the higher station apparatus 30 may be, for example, an access gateway apparatus, a radio network controller (RNC), a mobility management entity (MME) and so on, but is by no means limited to these. Also, each radio base station 12 may be connected with higher station apparatus 30 via the radio base station 11.

Note that the radio base station 11 is a radio base station having a relatively wide coverage, and may be referred to as a "macro base station," a "central node," an "eNB" (eNodeB), a "transmitting/receiving point" and so on. Also, the radio base stations 12 are radio base stations having local coverages, and may be referred to as "small base stations," "micro base stations," "pico base stations," "femto base stations," "HeNBs" (Home eNodeBs), "RRHs" (Remote Radio Heads), "transmitting/receiving points" and so on. Hereinafter the radio base stations 11 and 12 will be collectively referred to as "radio base stations 10," unless specified otherwise.

The user terminals 20 are terminals to support various communication schemes such as LTE, LTE-A and so on, and may be either mobile communication terminals or stationary communication terminals.

In the radio communication system 1, as radio access schemes, OFDMA (Orthogonal Frequency Division Multiple Access) is applied to the downlink, and SC-FDMA (Single-Carrier Frequency Division Multiple Access) is applied to the uplink. OFDMA is a multi-carrier communication scheme to perform communication by dividing a frequency bandwidth into a plurality of narrow frequency bandwidths (subcarriers) and mapping data to each subcarrier. SC-FDMA is a single-carrier communication scheme to mitigate interference between terminals by dividing the system bandwidth (CCs) into bands formed with one or continuous resource blocks per terminal, and allowing a plurality of terminals to use mutually different bands. Incidentally, the uplink and downlink radio access schemes are not limited to these combinations, and OFDMA may be applied in the uplink.

In the radio communication system 1, a downlink shared channel (PDSCH: Physical Downlink Shared CHannel), which is used by each user terminal 20 on a shared basis, a broadcast channel (PBCH: Physical Broadcast CHannel), downlink L1/L2 control channels and so on are used as downlink channels. User data, higher layer control information and predetermined SIBs (System Information Blocks) are communicated in the PDSCH. Also, the MIB (Master Information Blocks) is communicated in the PBCH.

The downlink L1/L2 control channels include a PDCCH (Physical Downlink Control CHannel), an EPDCCH (Enhanced Physical Downlink Control CHannel), a PCFICH (Physical Control Format Indicator CHannel), a PHICH (Physical Hybrid-ARQ Indicator CHannel) and so on. Downlink control information (DCI) including PDSCH and PUSCH scheduling information is communicated by the PDCCH. The number of OFDM symbols to use for the PDCCH is communicated by the PCFICH. HARQ delivery acknowledgement signals (ACKs/NACKs) in response to the PUSCH are communicated by the PHICH. The EPDCCH is frequency-division-multiplexed with the PDSCH (downlink shared data channel) and used to communicate DCI and so on, like the PDCCH.

In the radio communication system 1, an uplink shared channel (PUSCH: Physical Uplink Shared CHannel), which is used by each user terminal 20 on a shared basis, an uplink control channel (PUCCH: Physical Uplink Control CHannel), a random access channel (PRACH: Physical Random Access CHannel) and so on are used as uplink channels. User data and higher layer control information are communicated by the PUSCH. Uplink control information (UCI: Uplink Control Information) including at least one of transmission acknowledgment information (ACK/NACK) and radio quality information (CQI), is communicated by the PUSCH or the PUCCH. By means of the PRACH, random access preambles for establishing connections with cells are communicated.

<Radio Base Station>

Figure 9:
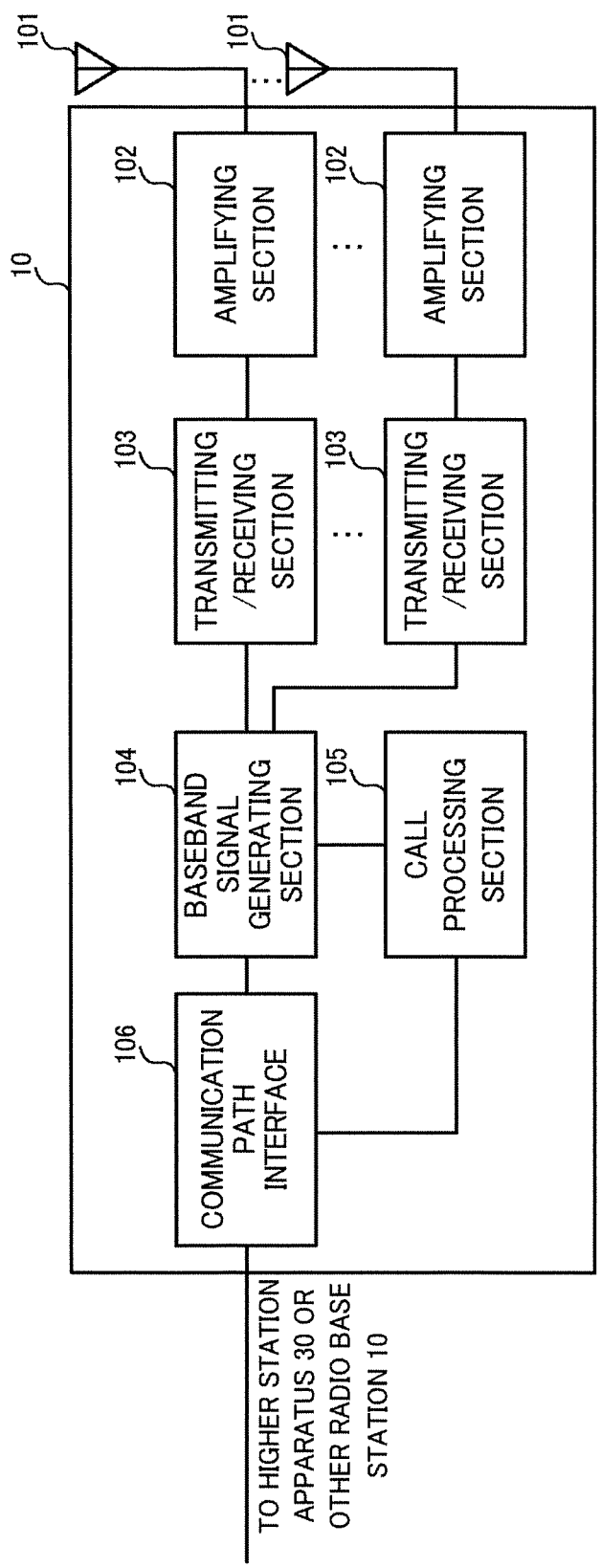
FIG. 9 is a diagram to show an example of an overall structure of a radio base station according to present embodiment.

FIG. 9 is a diagram to show an example of an overall structure of a radio base station according to present embodiment. A radio base station 10 has a plurality of transmitting/receiving antennas 101, amplifying sections 102, transmitting/receiving sections 103, a baseband signal processing section 104, a call processing section 105 and a communication path interface 106. Note that one or more transmitting/receiving antennas 101, amplifying sections 102 and transmitting/receiving sections 103 may be provided.

User data to be transmitted from the radio base station 10 to a user terminal 20 on the downlink is input from the higher station apparatus 30 to the baseband signal processing section 104, via the communication path interface 106.

In the baseband signal processing section 104, the user data is subjected to a PDCP (Packet Data Convergence Protocol) layer process, user data division and coupling, RLC (Radio Link Control) layer transmission processes such as RLC retransmission control, MAC (Medium Access Control) retransmission control (for example, an HARQ (Hybrid Automatic Repeat reQuest) transmission process), scheduling, transport format selection, channel coding, an inverse fast Fourier transform (IFFT) process and a precoding process, and the result is forwarded to each transmitting/receiving sections 103. Furthermore, downlink control signals are also subjected to transmission processes such as channel coding and an inverse fast Fourier transform, and forwarded to each transmitting/receiving sections 103.

Baseband signals that are pre-coded and output from the baseband signal processing section 104 on a per antenna basis are converted into a radio frequency band in the transmitting/receiving sections 103, and then transmitted. The radio frequency signals having been subjected to frequency conversion in the transmitting/receiving sections 103 are amplified in the amplifying sections 102, and transmitted from the transmitting/receiving antennas 101.

Meanwhile, as for uplink signals, radio frequency signals that are received in the transmitting/receiving antennas 101 are each amplified in the amplifying sections 102. The transmitting/receiving sections 103 receive the uplink signals amplified in the amplifying sections 102. The received signals are converted into the baseband signal through frequency conversion in the transmitting/receiving sections 103 and output to the baseband signal processing section 104.

In the baseband signal processing section 104, user data that is included in the uplink signals that are input is subjected to a fast Fourier transform (FFT) process, an inverse discrete Fourier transform (IDFT) process, error correction decoding, a MAC retransmission control receiving process, and RLC layer and PDCP layer receiving processes, and forwarded to the higher station apparatus 30 via the communication path interface 106. The call processing section 105 performs call processing such as setting up and releasing communication channels, manages the state of the radio base station 10 and manages the radio resources.

The communication path interface section 106 transmits and receives signals to and from the higher station apparatus 30 via a predetermined interface. Also, the communication path interface 106 may transmit and/or receive signals (backhaul signaling) with other radio base stations 10 via an inter-base station interface (for example, an interface in compliance with the CPRI (Common Public Radio Interface), such as optical fiber, the X2 interface, etc.).

Further, the transmitting/receiving sections 103 receive a coded bit sequence of transmission acknowledgment information (HARQ-ACK) of a downlink data signal (downlink shared channel (PDSCH)) of at least one CC and a coded bit sequence of channel state information (CSI) of at least one CC mapped to radio resources constituting the same uplink control signal (uplink control channel (PUCCH)). Further, the transmitting/receiving sections 103 may receive the encoded HARQ-ACK (and SR) bit sequencer and the encoded CSI bit sequence.

The transmitting/receiving sections 103 can be constituted by transmitters/receivers, transmitting/receiving circuits or transmitting/receiving devices that can be described based on common understanding of the technical field to which the present invention pertains. Note that a transmitting/receiving sections 103 may be structured as a transmitting/receiving section in one entity, or may be constituted by a transmission section and a receiving section.

Figure 10:
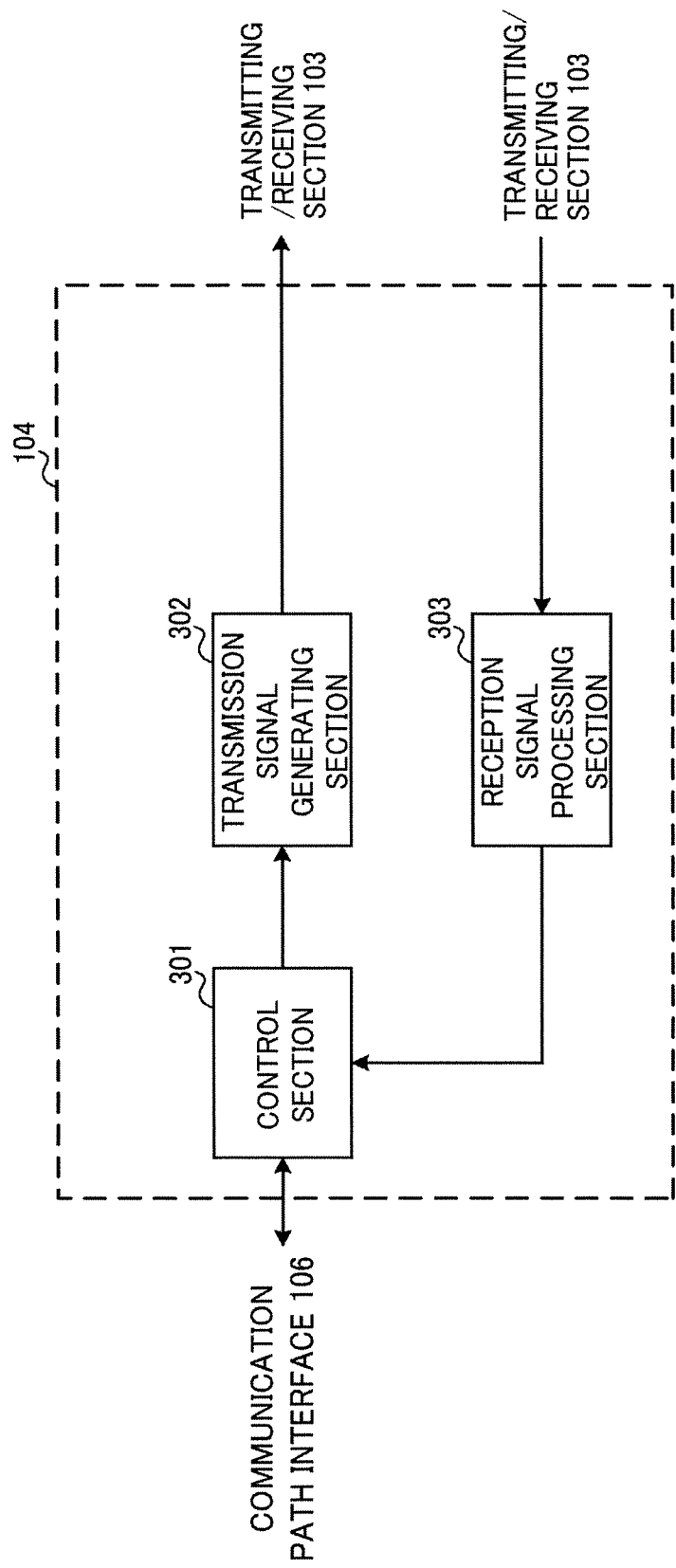
FIG. 10 is a diagram to show an example of a functional structure of a radio base station according to present embodiment.

FIG. 10 is a diagram to show an example of a functional structure of a radio base station according to present embodiment. Note that, although FIG. 10 primarily shows functional blocks that pertain to characteristic parts of the present embodiment, the radio base station 10 has other functional blocks that are necessary for radio communication as well. As shown in FIG. 10, the baseband signal processing section 104 has a control section (scheduler) 301, a transmission signal generation section (generating section) 302, a mapping section 303 and a received signal processing section 304.

The control section 301 controls the entire radio base station 10. The control section 301 controls, for example, generation of a downlink signal by the transmission signal generation section 302 and reception processing of a signal by the received signal processing section 303.

Specifically, the control section 301 performs transmission control of downlink user data (for example, modulation scheme, coding rate, etc.), allocation (scheduling) of a downlink shared channel (PDSCH) to the user terminal 20, and retransmission control based on transmission acknowledgment information (HARQ-ACK) from user terminal 20.

In addition, the control section 301 performs reception control of uplink user data, allocation (scheduling) of an uplink shared channel (PUSCH) to the user terminal 20, transmission control of acknowledgment information (HARQ-ACK) for PUSCH, demodulation, decoding, etc.).

Furthermore, the control section 301 controls the carrier aggregation (CA) of the user terminal 20. To be more specific, the control section 301 may control the transmission signal generation section 302 to determine application of CA/changes in the number of CCs and so on, based on CSI or the like reported from the user terminals 20, and generate information to indicate such application/changes. Note that the information to indicate the application/changes may be included in control information sent by higher layer signaling.

The control section 301 can be constituted by a controller, a control circuit or a control device that can be described based on common understanding of the technical field to which the present invention pertains.

The transmission signal generation section 302 performs generation processing (for example, addition of CRC bits, coding, modulation, mapping, IFFT, multiplication of spreading code, etc.) of downlink signals (including a downlink data signal and a downlink control signal) based on commands from the control section 301.

To be more specific, the transmission signal generation section 302 generates the downlink data signal (PDSCH) including the notification information (control information) based on higher layer signaling and the user data, and outputs the generated downlink data signal (PDSCH) to the transmitting/receiving sections 103. Further, the transmission signal generation section 302 generates a downlink control signal (PDCCH) including the DCI and outputs the generated control signal to the transmitting/receiving sections 103. Furthermore, the transmission signal generation section 302 generates a downlink reference signal such as the CRS, the CSI-RS and so on, and outputs these signals to transmitting/receiving sections 103.

For the transmission signal generation section 302, a signal generator, a signal generating circuit or a signal generating device that can be described based on common understanding of the technical field to which the present invention pertains can be used.

The received signal processing section 303 performs receiving processes (for example, demapping, demodulation, decoding and so on) of received signals that are input from the user terminals. The processing results are output to the control section 301.

To be more specific, the received signal processing section 303 detects the PUCCH format and performs the receiving process of UCI (at least one of HARQ-ACK, CQI, and SR). Also, the received signal processing section 303 separately decodes at least one CC's HARQ-ACK (and SR)

and at least one CC's CSI mapped in a new PUCCH format. The received signal processing section 303 constitutes the decoding section of the present invention.

The receiving process section 303 can be constituted by a signal processor, a signal processing circuit or a signal processing device, and a measurer, a measurement circuit or a measurement device that can be described based on common understanding of the technical field to which the present invention pertains.

<User Terminal>

Figure 11:
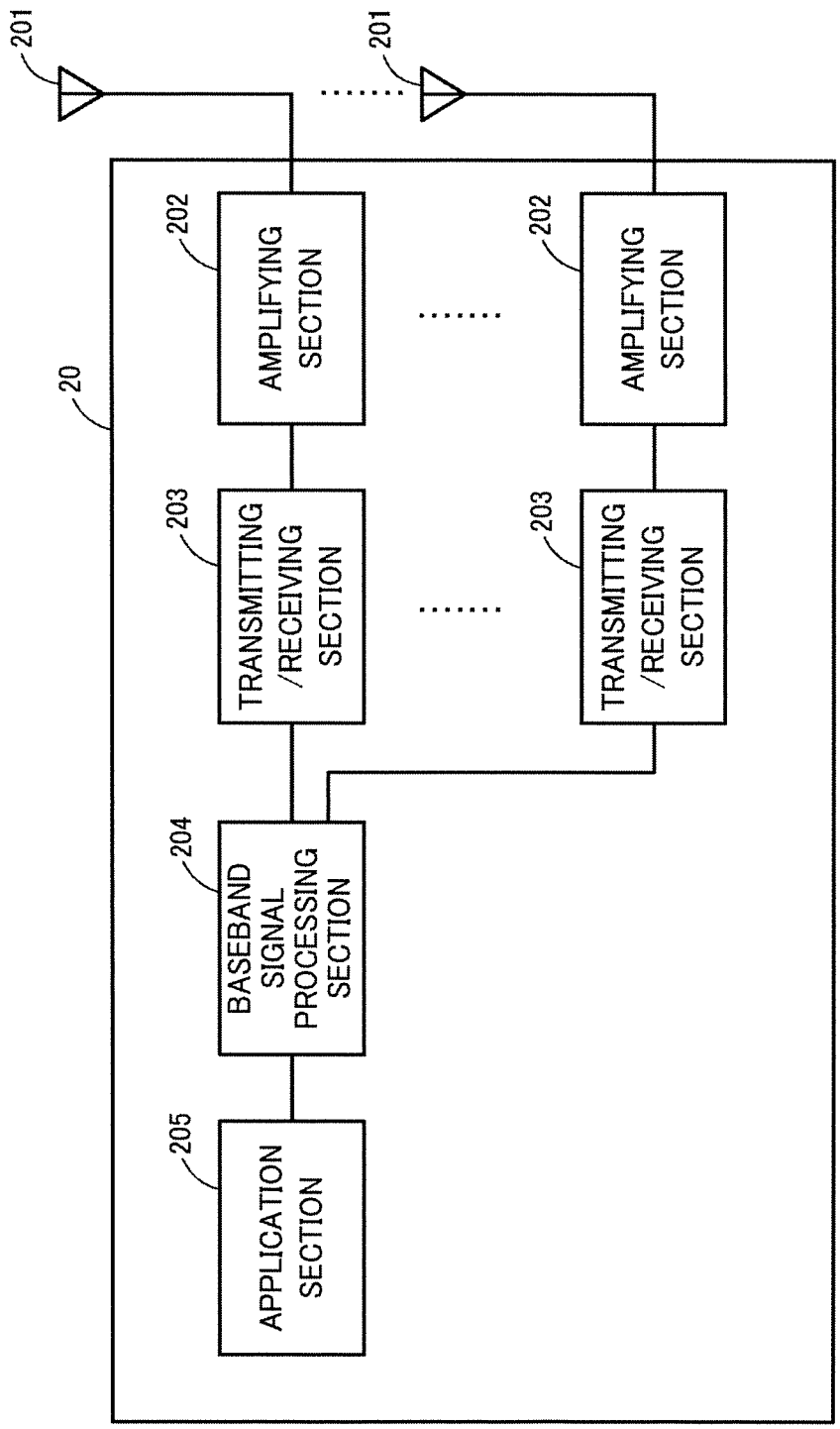
FIG. 11 is a diagram to show an example of an overall structure of a user terminal according to present embodiment.

FIG. 11 is a diagram to show an example of an overall structure of a user terminal according to an embodiment of the present invention. A user terminal 20 has a plurality of transmitting/receiving antennas 201 for MIMO communication, amplifying sections 202, transmitting/receiving sections 203, a baseband signal processing section 204 and an application section 205.

Radio frequency signals that are received in a plurality of transmitting/receiving antennas 201 are each amplified in the amplifying sections 202. Each transmitting/receiving section 203 receives the downlink signals amplified in the amplifying sections 202. The received signal is subjected to frequency conversion and converted into the baseband signal in the transmitting/receiving sections 203, and output to the baseband signal processing section 204.

In the baseband signal processing section 204, the baseband signal that is input is subjected to an FFT process, error correction decoding, a retransmission control receiving process, and so on. Downlink user data is forwarded to the application section 205. The application section 205 performs processes related to higher layers above the physical layer and the MAC layer, and so on. Furthermore, in the downlink data, broadcast information is also forwarded to the application section 205.

Meanwhile, uplink user data is input from the application section 205 to the baseband signal processing section 204. The baseband signal processing section 204 performs a retransmission control transmission process (for example, an HARQ transmission process), channel coding, pre-coding, a discrete Fourier transform (DFT) process, an IFFT process and so on, and the result is forwarded to each transmitting/receiving section 203. The baseband signal that is output from the baseband signal processing section 204 is converted into a radio frequency bandwidth in the transmitting/receiving sections 203. The radio frequency signals that are subjected to frequency conversion in the transmitting/receiving sections 203 are amplified in the amplifying sections 202, and transmitted from the transmitting/receiving antennas 201.

Further, the transmitting/receiving section 203 transmits encoded HARQ-ACK (and SR) bit sequence for a downlink data signal of at least one CC (downlink shared channel (PDSCH)) and coded bit sequence of channel state information (CSI) of at least one CC mapped to the radio resources constituting the same uplink control signal (uplink control channel (PUCCH)).

For the transmitting/receiving sections 203, transmitters/receivers, transmitting/receiving circuits or transmitting/receiving devices that can be described based on common understanding of the technical field to which the present invention pertains can be used. Furthermore, a transmitting/receiving section 203 may be structured as one transmitting/receiving section, or may be formed with a transmission section and a receiving section.

Figure 12:
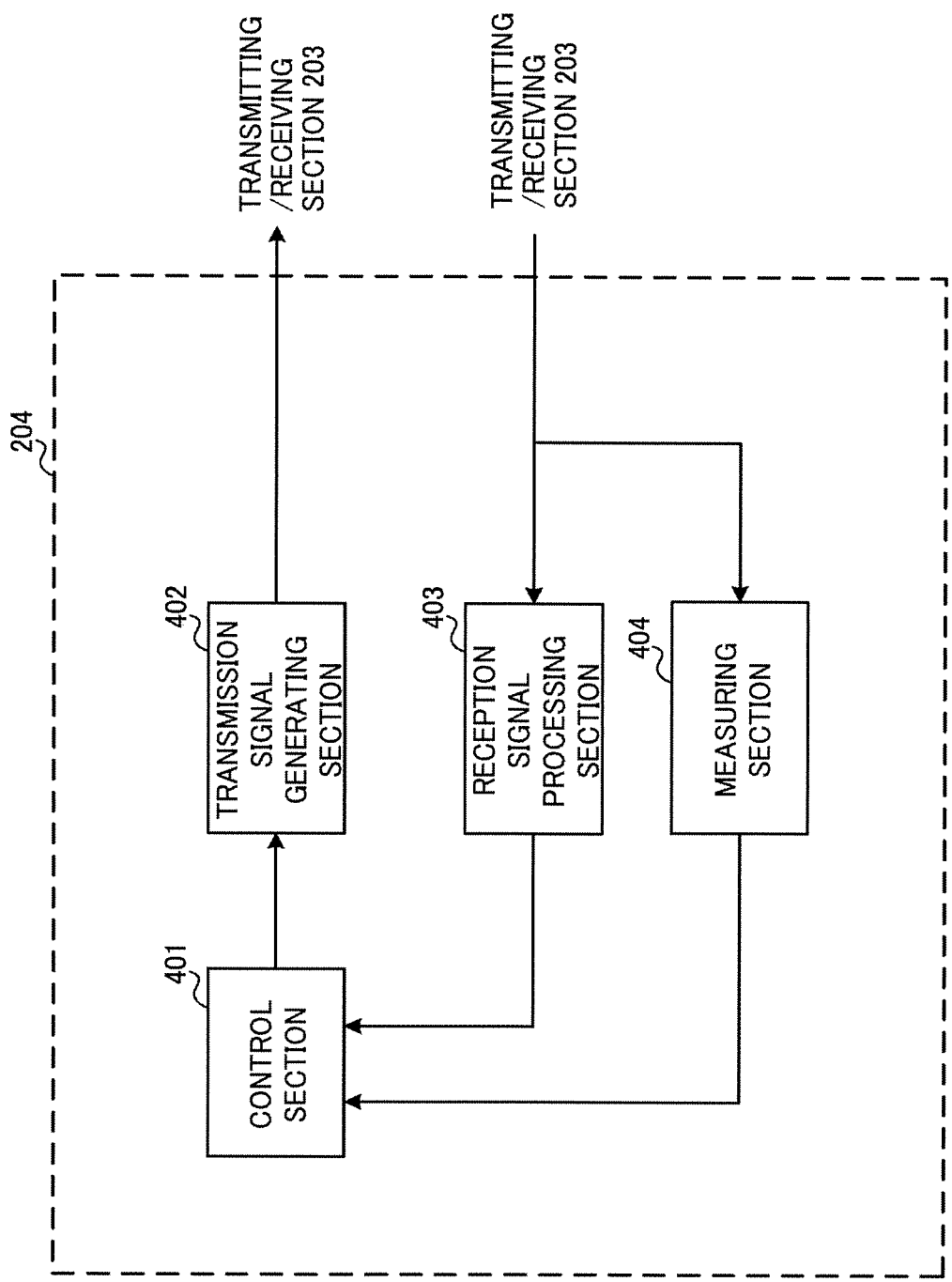
FIG. 12 is a diagram to show an example of a functional structure of a user terminal according to present embodiment.

FIG. 12 is a diagram to show an example of a functional structure of a user terminal according to the present embodiment. Note that, although FIG. 12 primarily shows functional blocks that pertain to characteristic parts of the present embodiment, the user terminal 20 has other functional blocks that are necessary for radio communication as well. As shown in FIG. 12, the baseband signal processing section 204 provided in the user terminal 20 has a control section 401, a transmission signal generation section 402, a received signal processing section 403 and a measurement section 404.

The control section 401 controls the whole of the user terminal 20. The control section 401 controls generation of a signal by the transmission signal generation section 402 and reception processing of a signal by the received signal processing section 403, for example.

To be more specific, the control section 401 controls the PUCCH format to be applied for transmission of UCI (at least one of HARQ-ACK, CQI, and SR). Specifically, when the number of CCs configured in the user terminal 20 or the number of CCs scheduled in the user terminal 20 is equal to or more than a predetermined number (for example, 6), the control section 401 may apply a new PUCCH format.

Further, the control section 401 controls the transmission subframe of the periodic CSI (P-CSI) of each CC. Specifically, the control section 401 controls the transmission signal generation section 402 so as to transmit the P-CSI in the transmission subframe that is configured by higher layer signaling.

Further, the control section 401 controls encoding of UCI including at least HARQ-ACK and P-CSI and/or mapping of UCI to PUCCH format (for example, new PUCCH format or PUCCH format 3).

Specifically, the control section 401 controls the transmission signal generation section 402 so that at least one CC's HARQ-ACK (and SR) and at least one CC's P-CSI are separately coded.

Further, the control section 401 may control the transmission signal generation section 402 so that an encoded HARQ-ACK (and SR) bit sequence and an encoded P-CSI bit sequence are mapped to the same SC-FDMA symbol. Alternatively, the control section 401 may control the transmission signal generation section 402 to map an encoded HARQ-ACK (and SR) bit sequence and an encoded P-CSI bit sequence to different SC-FDMA symbols constituting the same PUCCH (that is, different SC-FDMA symbols in the new PUCCH format).

Further, the control section 401 may control the signal generation section 402 to map the encoded HARQ-ACK (and SR) bit sequence to a predetermined number of SC-FDMA symbols near the SC-FDMA symbol to which the DM-RS is mapped.

Also, when the bit length of P-CSI before encoding exceeds a predetermined threshold, or when the number of P-CSI CCs exceeds a predetermined threshold, the control section 401 may control the transmission signal generation section 402 so as to drop at least a part of the PSI bit sequence before encoding (condition 1). Here, the predetermined threshold value may be configured in the user terminal 20 by higher layer signaling from the radio base station 10.

Further, when the bit length of the P-CSI after the encoding and/or parity puncturing exceeds a predetermined threshold value, the control section 401 may control the transmission signal generation section 402 so as to drop at least a part of the PSI bit sequence before encoding (condition 2). Here, the predetermined threshold value may be configured by higher layer signaling. Alternatively, the control section 401 may determine the predetermined threshold based on at least one of the ratio of the P-CSI payload to the maximum payload in the new PUCCH format, the number of SC-FDMA symbols for P-CSI, the number of subcarriers for P-CSI and the number of PRBs for P-CSI.

Further, when the coding rate of P-CSI exceeds a predetermined threshold value, the control section 401 may control the transmission signal generation section 402 so as to drop at least a part of the PSI bit sequence before encoding (condition 3). Here, the predetermined threshold value may be configured by higher layer signaling. Alternatively, the control section 401 may determine the predetermined threshold value based on at least one of the ratio of the P-CSI payload to the maximum payload in the new PUCCH format, the number of SC-FDMA symbols for P-CSI, the number of subcarriers for P-CSI and the number of PRBs for P-CSI.

Also, when the total bit length (the number of bits) of the encoded HARQ-ACK (and SR) bit sequence and the encoded P-CSI bit sequence exceeds the maximum payload of the new PUCCH format, the control section 401 may control the transmission signal generation section 402 so that at least one of the encoded HARQ-ACK (and SR) bit sequence and the encoded P-CSI bit sequence is punctured (and/or interleaved) so that the sequences are adjusted to the maximum payload and then mapped (multiplexed) to the new PUCCH format.

Also, when the total bit length (the number of bits) of the encoded HARQ-ACK (and SR) bit sequence and the encoded P-CSI bit sequence is less than the maximum payload of the new PUCCH format, the control section 401 may control the transmission signal generation section 402 so that at least one of the encoded HARQ-ACK (and SR) bit sequence and the encoded P-CSI bit sequence is repeated (repetition) so that the sequences are adjusted to the maximum payload and then mapped (multiplexed) to the new PUCCH format.

Further, the control section 401 controls carrier aggregation (CA). To be more specific, the control section 401 performs CA based on information indicating the application/change of CA reported from the radio base station 10.

For the control section 401, a controller, a control circuit or a control device that can be described based on common understanding of the technical field to which the present invention pertains can be used. Further, the control section 401 and a transmission signal generation section 402 to be described later constitute a control section of the present invention.

The transmission signal generation section 402 generates uplink signals (including an uplink data signals and an uplink control signals) based on commands from the control section 401, and outputs the uplink signals to the transmitting/receiving section 203. For example, the transmission signal generation section 402 generates uplink control signals (PUCCH) including UCI (at least one of HARQ-ACK, CQI, and SR).

Further, the transmission signal generation section 402 separately encodes the HARQ-ACK (and SR) and the P-CSI according to a command from the control section 401. The transmission signal generation section 402 constitutes the coding section of the present invention. Further, the transmission signal generation section 402 performs the above-described dropping processing, repetition processing, and puncturing processing (and/or interleave processing) according to commands from the control section 401.

Further, the transmission signal generation section 402 maps the encoded HARQ-ACK (and SR) bit sequence and the encoded P-CSI bit sequence to radio resources forming the new PUCCH format (same PUCCH) according to a command from the control section 401.

For example, the transmission signal generation section 402 may map the encoded HARQ-ACK (and SR) bit sequence and the encoded P-CSI bit sequence to the same SC-FDMA symbol constituting the new PUCCH format. Alternatively, the transmission signal generation section 402 may maps the encoded HARQ-ACK (and SR) bit sequence and the encoded P-CSI bit sequence to different SC-FDMA symbols constituting the new PUCCH format.

In addition, the transmission signal generation section 402 may multiply a symbol sequence obtained by applying DFT and IFFT to a SC-FDMA symbol (modulation symbol) where a coded bit sequence is mapped, by a spreading code of a predetermined spreading factor.

For the transmission signal generation section 402, a signal generator, a signal generating circuit or a signal generating device that can be described based on common understanding of the technical field to which the present invention pertains can be used. The received signal processing section 402 and the transmitting/receiving section 203 can constitute the transmission section according to the present invention.

The received signal processing section 403 performs the receiving process (for example, demapping, demodulation, decoding, etc.) on downlink signals (including downlink control signals and downlink data signals). The received signal processing section 403 outputs the information received from the radio base station 10, to the control section 401. The received signal processing section 403 outputs, for example, broadcast information, system information, control information by higher layer signaling such as RRC signaling, DCI, and the like, to the control section 401.

The received signal processing section 403 can be constituted by a signal processor, a signal processing circuit or a signal processing device that can be described based on common understanding of the technical field to which the present invention pertains. The received signal processing section 403 and the transmitting/receiving section 203 can constitute the receiving section according to the present invention.

The measurement section 404 measures channel states based on reference signals (for example, CSI-RS) from the radio base station 10, and outputs the measurement results to the control section 401. Measurement of the channel state may be performed for each CC.

The measurement section 404 can be constituted by a signal processor, a signal processing circuit or a signal processing device, and a measurer, a measurement circuit or a measurement device that can be described based on common understanding of the technical field to which the present invention pertains.

Note that the block diagrams that have been used to describe the above embodiments show blocks in functional units. These functional blocks (components) may be implemented in arbitrary combinations of hardware and software. Also, the means for implementing each functional block is not particularly limited. That is, each functional block may be implemented with one physically-integrated device, or may be implemented by connecting two physically-separate devices via radio or wire and using these multiple devices.

For example, part or all of the functions of the radio base station 10 and the user terminal 20 may be implemented by using hardware such as an ASIC (Application-Specific Integrated Circuit), a PLD (Programmable Logic Device), an FPGA (Field Programmable Gate Array) and so on. Also, the radio base stations 10 and user terminals 20 may be implemented with a computer device that includes a processor (CPU), a communication interface for connecting with networks, a memory and a computer-readable storage medium that holds programs. That is, the radio base stations and user terminals according to an embodiment of the present invention may function as computers that execute the processes of the radio communication method of the present invention.

Here, the processor and the memory are connected with a bus for communicating information. Also, the computer-readable recording medium is a storage medium such as, for example, a flexible disk, an opto-magnetic disk, a ROM (Read Only Memory), an EPROM (Erasable Programmable ROM), a CD-ROM (Compact Disc-ROM), a RAM (Random Access Memory), a hard disk and so on. Also, the programs may be transmitted from the network through, for example, electric communication channels. Also, the radio base stations 10 and user terminals 20 may include input devices such as input keys and output devices such as displays.

The functional structures of the radio base stations 10 and user terminals 20 may be implemented with the above-described hardware, may be implemented with software modules that are executed on the processor, or may be implemented with combinations of both. The processor controls the whole of the user terminals 20 by running an operating system. Also, the processor reads programs, software modules and data from the storage medium into the memory, and executes various types of processes.

Here, these programs have only to be programs that make a computer execute each operation that has been described with the above embodiments. For example, the control section 401 of the user terminals 20 may be stored in the memory and implemented by a control program that operates on the processor, and other functional blocks may be implemented likewise.

Also, software and commands may be transmitted and received via communication media. For example, when software is transmitted from a website, a server or other remote sources by using wired technologies such as coaxial cables, optical fiber cables, twisted-pair cables and digital subscriber lines (DSL) and/or wireless technologies such as infrared radiation, radio and microwaves, these wired technologies and/or wireless technologies are also included in the definition of communication media.

Note that the terminology used in this description and the terminology that is needed to understand this description may be replaced by other terms that convey the same or similar meanings. For example, "channels" and/or "symbols" may be replaced by "signals" (or "signaling"). Also, "signals" may be "messages." Furthermore, "component carriers" (CCs) may be referred to as "carrier frequencies," "cells" and so on.

Also, the information and parameters described in this description may be represented in absolute values or in relative values with respect to a predetermined value, or may be represented in other information formats. For example, radio resources may be specified by indices.

The information, signals and/or others described in this description may be represented by using a variety of different technologies. For example, data, instructions, commands, information, signals, bits, symbols and chips, all of which may be referenced throughout the description, may be represented by voltages, currents, electromagnetic waves, magnetic fields or particles, optical fields or photons, or any combination of these.

The example s/embodiments illustrated in this description may be used individually or in combinations, and the mode of may be switched depending on the implementation. Also, a report of predetermined information (for example, a report to the effect that "X holds") does not necessarily have to be sent explicitly, and can be sent implicitly (by, for example, not reporting this piece of information).

Reporting of information is by no means limited to the example s/embodiments described in this description, and other methods may be used as well. For example, reporting of information may be implemented by using physical layer signaling (for example, DCI (Downlink Control Information) and UCI (Uplink Control Information)), higher layer signaling (for example, RRC (Radio Resource Control) signaling, MAC (Medium Access Control) signaling, and broadcast information (the MIB (Master Information Block) and SIBs (System Information Blocks))), other signals or combinations of these. Also, RRC signaling may be referred to as "RRC messages," and can be, for example, an RRC connection setup message, RRC connection reconfiguration message, and so on.

The examples/embodiments illustrated in this description may be applied to LTE (Long Term Evolution), LTE-A (LTE-Advanced), SUPER 3G, IMT-Advanced, 4G, 5G, FRA (Future Radio Access), CDMA 2000, UMB (Ultra Mobile Broadband), IEEE 802.11 (Wi-Fi), IEEE 802.16 (WiMAX), IEEE 802.20, UWB (Ultra-WideBand), Bluetooth (registered trademark), and other adequate systems, and/or next-generation systems that are enhanced based on these.

The order of processes, sequences, flowcharts and so on that have been used to describe the examples/embodiments herein may be re-ordered as long as inconsistencies do not arise. For example, although various methods have been illustrated in this description with various components of steps in exemplary orders, the specific orders that illustrated herein are by no means limiting.

Now, although the present invention has been described in detail above, it should be obvious to a person skilled in the art that the present invention is by no means limited to the embodiments described herein. The present invention can be implemented with various corrections and in various modifications, without departing from the spirit and scope of the present invention defined by the recitations of claims. Consequently, the description herein is provided only for the purpose of explaining example s, and should by no means be construed to limit the present invention in any way.

The disclosure of Japanese Patent Application No. 2015-187123, filed on Sep. 24, 2015, including the specification, drawings and abstract, is incorporated herein by reference in its entirety.

The invention claimed is:

1. A terminal comprising:
a processor that separately encodes a first uplink control information (UCI) and a second UCI; and
a transmitter that transmits the first UCI and the second UCI using an uplink control channel,
wherein a first part of an encoded bit sequence of the first UCI is mapped to a first symbol set of the uplink control channel, and both of a remaining part of the encoded bit sequence of the first UCI and an encoded bit sequence of the second UCI are mapped to a second symbol set of the uplink control channel,
the first UCI includes transmission acknowledgement information of a downlink shared channel, and the second UCI includes channel state information,
the remaining part of the encoded bit sequence of the first UCI is mapped, in the second symbol set, to a subcarrier determined based on a number of the remaining part of the encoded bit sequence of the first UCI, all of the remaining part other than the first part of the encoded bit sequence of the first UCI is mapped to a symbol in the second symbol set, the symbol being adjacent to the first symbol set, and the transmission acknowledgement information is mapped to a symbol that is closer to a demodulation reference signal of the uplink control channel than a UCI other than the transmission acknowledgement information.

2. The terminal according to claim 1, wherein the first symbol set is closer to the demodulation reference signal of the uplink control channel than the second symbol set.

3. The terminal according to claim 1, wherein the processor controls dropping of at least a part of the channel state information based on a number of physical resource blocks, a number of symbols and a number of subcarriers which are allocated to the uplink control channel, and a coding rate.

4. The terminal according to claim 1, wherein the remaining part of the encoded bit sequence of the first UCI is mapped, in the second symbol set, to a symbol adjacent to a symbol of the acknowledgment signal.

5. A base station configured to receive a first uplink control information (UCI) and a second UCI that have been separately encoded by a terminal, the base station comprising:

a receiver that receives the first UCI and the second UCI using an uplink control channel, wherein a first part of an encoded bit sequence of the first UCI is mapped to a first symbol set of the uplink control channel, and both of a remaining part of the encoded bit sequence of the first UCI and an encoded bit sequence of the second UCI are mapped to a second symbol set of the uplink control channel; and a processor that controls decoding of the first UCI and the second UCI that are encoded separately, wherein the first UCI includes transmission acknowledgement information of a downlink shared channel, and the second UCI includes channel state information, the remaining part of the encoded bit sequence of the first UCI is mapped, in the second symbol set, to a subcarrier determined based on a number of the remaining part of the encoded bit sequence of the first UCI, all of the remaining part other than the first part of the encoded bit sequence of the first UCI is mapped to a symbol in the second symbol set, the symbol being adjacent to the first symbol set, and the transmission acknowledgement information is mapped to a symbol that is closer to a demodulation reference signal of the uplink control channel than a UCI other than the transmission acknowledgement information.

6. The base station according to claim 5, wherein the remaining part of the encoded bit sequence of the first UCI is mapped, in the second symbol set, to a symbol adjacent to a symbol of the acknowledgment signal.

7. A radio communication method comprising:

separately encoding a first uplink control information (UCI) and a second UCI; and transmitting the first UCI and the second UCI using an uplink control channel, wherein a first part of an encoded bit sequence of the first UCI is mapped to a first symbol set of the uplink control channel, and both of a remaining part of the encoded bit sequence of the first UCI and an encoded bit sequence of the second UCI are mapped to a second symbol set of the uplink control channel, the first UCI includes transmission acknowledgement information of a downlink shared channel, and the second UCI includes channel state information, the remaining part of the encoded bit sequence of the first UCI is mapped, in the second symbol set, to a subcarrier determined based on a number of the remaining part of the encoded bit sequence of the first UCI, all of the remaining part other than the first part of the encoded bit sequence of the first UCI is mapped to a symbol in the second symbol set, the symbol being adjacent to the first symbol set, and the transmission acknowledgement information is mapped to a symbol that is closer to a demodulation reference signal of the uplink control channel than a UCI other than the transmission acknowledgement information.

8. The radio communication method according to claim 7, wherein the remaining part of the encoded bit sequence of the first UCI is mapped, in the second symbol set, to a symbol adjacent to a symbol of the acknowledgment signal.

9. A system comprising a base station and a terminal, wherein:

the base station comprises:

a receiver that receives a first uplink control information (UCI) and a second UCI using an uplink control channel;

a processor of the base station that controls decoding of the first UCI and the second UCI; and the terminal comprises:

a processor of the terminal that separately encodes the first UCI and the second UCI; and a transmitter that transmits the first UCI and the second UCI using the uplink control channel, wherein a first part of an encoded bit sequence of the first UCI is mapped to a first symbol set of the uplink control channel, and both of a remaining part of the encoded bit sequence of the first UCI and an encoded bit sequence of the second UCI are mapped to a second symbol set of the uplink control channel, the first UCI includes transmission acknowledgement information of a downlink shared channel, and the second UCI includes channel state information, the remaining part of the encoded bit sequence of the first UCI is mapped, in the second symbol set, to a subcarrier determined based on a number of the remaining part of the encoded bit sequence of the first UCI, all of the remaining part other than the first part of the encoded bit sequence of the first UCI is mapped to a symbol in the second symbol set, the symbol being adjacent to the first symbol set, and the transmission acknowledgement information is mapped to a symbol that is closer to a demodulation reference signal of the uplink control channel than a UCI other than the transmission acknowledgement information.

* * * * *